(12) United States Patent
Cheng et al.

(10) Patent No.: US 12,402,364 B2
(45) Date of Patent: Aug. 26, 2025

(54) SEMICONDUCTOR DEVICE STRUCTURE AND METHOD FOR FORMING THE SAME

(71) Applicant: Taiwan Semiconductor Manufacturing Company, Ltd., Hsinchu (TW)

(72) Inventors: Kuan-Hao Cheng, Hsinchu (TW); Wei-Yang Lee, Taipei (TW); Tzu-Hua Chiu, Hsinchu (TW); Wei-Han Fan, Hsin-Chu (TW); Po-Yu Lin, New Taipei (TW); Chia-Pin Lin, Xinpu Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 596 days.

(21) Appl. No.: 17/377,961

(22) Filed: Jul. 16, 2021

(65) Prior Publication Data

US 2023/0018480 A1    Jan. 19, 2023

(51) Int. Cl.
| | |
|---|---|
| *H10D 30/69* | (2025.01) |
| *H10D 30/01* | (2025.01) |
| *H10D 30/67* | (2025.01) |
| *H10D 62/10* | (2025.01) |
| *H10D 64/01* | (2025.01) |

(52) U.S. Cl.
CPC ......... *H10D 30/797* (2025.01); *H10D 30/031* (2025.01); *H10D 30/6757* (2025.01); *H10D 62/116* (2025.01); *H10D 62/121* (2025.01); *H10D 64/018* (2025.01); *H10D 30/6735* (2025.01)

(58) Field of Classification Search
CPC ........... H01L 29/42392; H01L 29/6656; H01L 29/66553; H01L 27/088; H01L 29/7848; H10D 30/797; H10D 30/031; H10D 30/6757; H10D 30/6735; H10D 62/116; H10D 62/121; H10D 62/018
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |

(Continued)

*Primary Examiner* — Britt D Hanley
*Assistant Examiner* — Casey Paul Boatman
(74) *Attorney, Agent, or Firm* — Birch, Stewart, Kolasch & Birch, LLP

(57) ABSTRACT

A semiconductor device structure is provided. The semiconductor device structure includes a substrate having a base and a fin over the base. The semiconductor device structure includes a gate stack over a top portion of the fin. The semiconductor device structure includes a first nanostructure over the fin and passing through the gate stack. The semiconductor device structure includes a second nanostructure over the first nanostructure and passing through the gate stack. The first nanostructure is thicker than the second nanostructure. The semiconductor device structure includes a stressor structure over the fin and connected to the first nanostructure and the second nanostructure.

20 Claims, 17 Drawing Sheets

(56) References Cited

U.S. PATENT DOCUMENTS

| | | | |
|---|---|---|---|
| 9,536,738 B2 | 1/2017 | Huang et al. | |
| 9,576,814 B2 | 2/2017 | Wu et al. | |
| 9,608,116 B2 | 3/2017 | Ching et al. | |
| 11,444,178 B2* | 9/2022 | Yin | H10D 30/6735 |
| 2017/0054023 A1* | 2/2017 | Li | H10D 62/822 |
| 2018/0122900 A1* | 5/2018 | Cheng | H01L 29/0673 |
| 2018/0175167 A1* | 6/2018 | Reboh | H01L 29/7848 |
| 2018/0301564 A1* | 10/2018 | Kwon | H01L 29/0653 |
| 2019/0067122 A1* | 2/2019 | Cheng | H01L 21/02603 |
| 2019/0198639 A1* | 6/2019 | Kim | H01L 29/66795 |
| 2020/0168742 A1* | 5/2020 | Wang | H01L 21/02532 |
| 2020/0395237 A1* | 12/2020 | Lin | H10D 62/021 |
| 2021/0035870 A1* | 2/2021 | Young | H10D 30/031 |
| 2021/0066294 A1* | 3/2021 | Huang | H01L 29/66545 |
| 2022/0020849 A1* | 1/2022 | Yeom | H01L 21/823864 |
| 2022/0122893 A1* | 4/2022 | Lai | H01L 29/6653 |
| 2022/0190109 A1* | 6/2022 | Choi | H10D 62/121 |

* cited by examiner

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 2H-1 is a perspective view of the semiconductor device structure of FIG. 2H, in accordance with some embodiments.

FIG. 2H-2 is a cross-sectional view illustrating the semiconductor device structure along a sectional line 2H-2-2H-2' in FIG. 2H-1, in accordance with some embodiments.

DETAILED DESCRIPTION

Figure 1A:
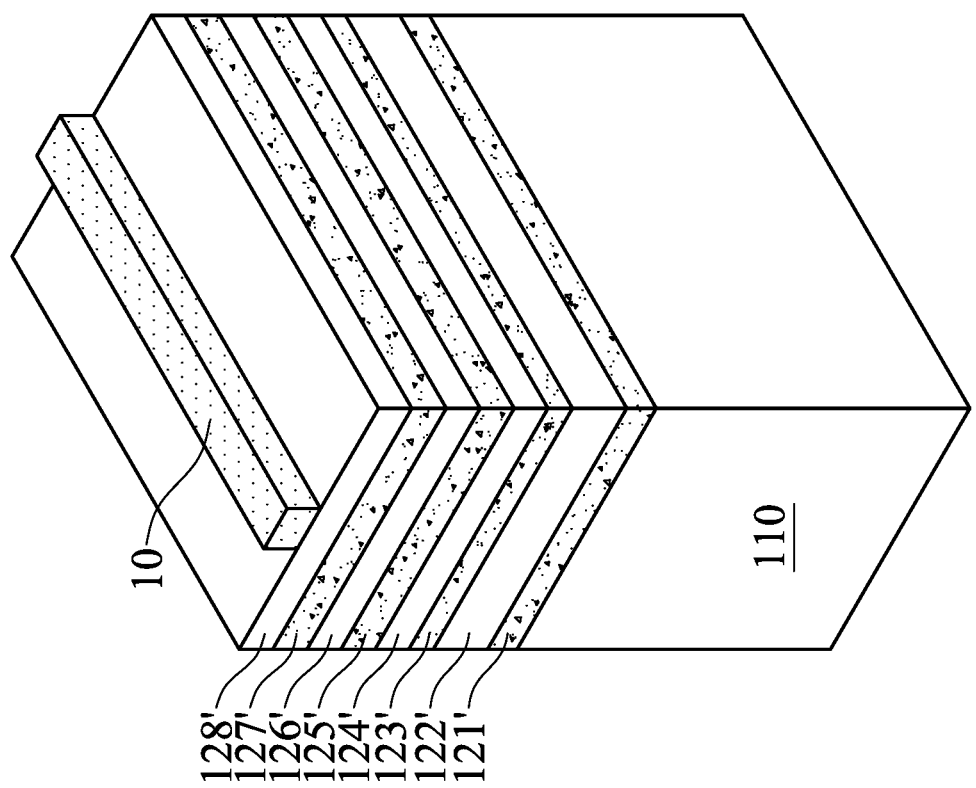
FIGS. 1A-1B are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 1B:
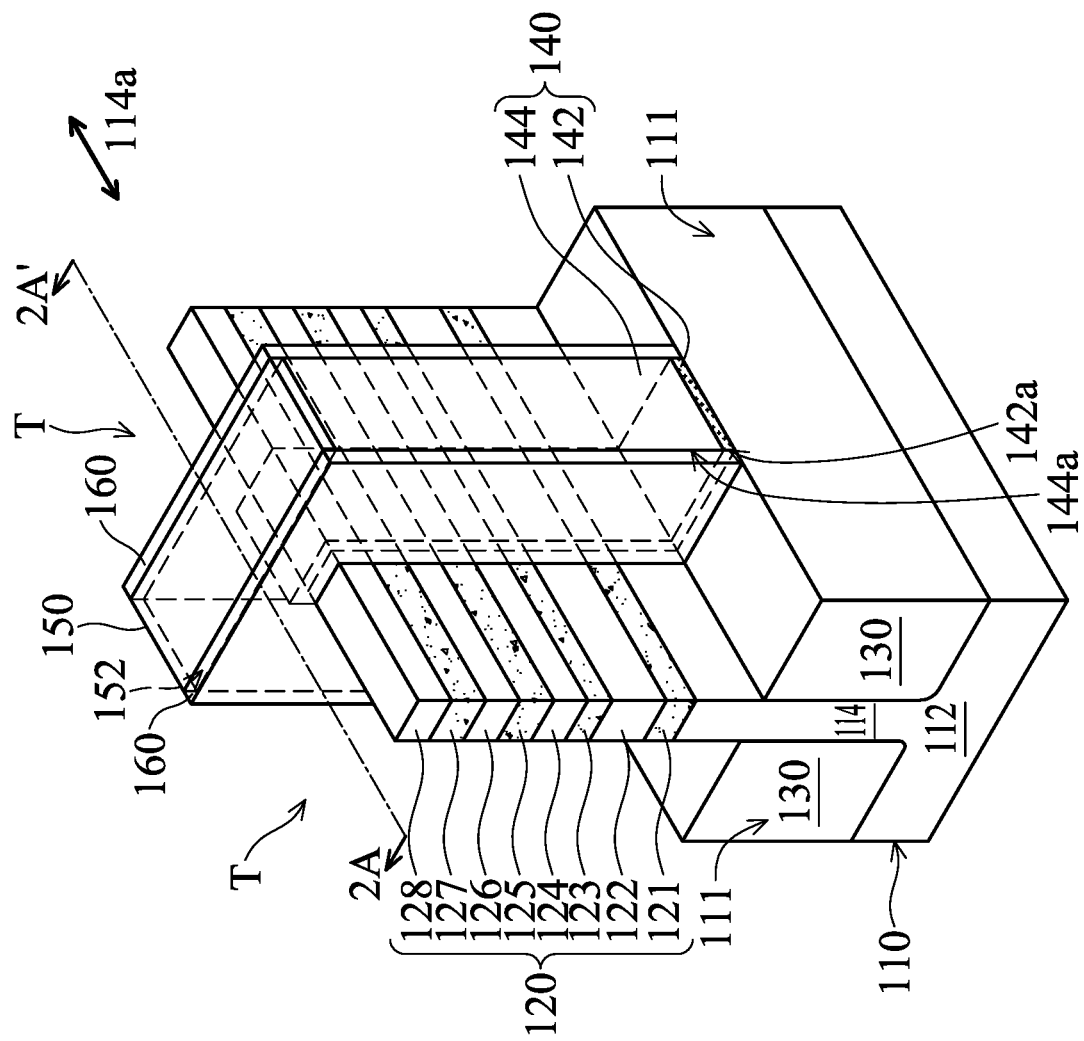

FIGS. 1A-1B are perspective views of various stages of a process for forming a semiconductor device structure, in accordance with some embodiments. As shown in FIG. 1A, a substrate 110 is provided, in accordance with some embodiments. The substrate 110 includes, for example, a semiconductor substrate. The substrate 110 includes, for example, a semiconductor wafer (such as a silicon wafer) or a portion of a semiconductor wafer.

In some embodiments, the substrate 110 is made of an elementary semiconductor material including silicon or germanium in a single crystal structure, a polycrystal structure, or an amorphous structure. In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIG. 1A, a semiconductor layer 121' is formed over the substrate 110, in accordance with some embodiments. The semiconductor layer 121' is formed using an epitaxial process or a deposition process, such as a chemical vapor deposition process or a physical vapor deposition process, in accordance with some embodiments.

As shown in FIG. 1A, a semiconductor layer 122' is formed over the semiconductor layer 121', in accordance with some embodiments. The semiconductor layer 122' is formed using an epitaxial process or a deposition process, such as a chemical vapor deposition process or a physical vapor deposition process, in accordance with some embodiments.

As shown in FIG. 1A, a semiconductor layer 123' is formed over the semiconductor layer 122', in accordance with some embodiments. The semiconductor layer 123' is formed using an epitaxial process or a deposition process, such as a chemical vapor deposition process or a physical vapor deposition process, in accordance with some embodiments.

As shown in FIG. 1A, a semiconductor layer 124' is formed over the semiconductor layer 123', in accordance with some embodiments. The semiconductor layer 124' is formed using an epitaxial process or a deposition process, such as a chemical vapor deposition process or a physical vapor deposition process, in accordance with some embodiments.

As shown in FIG. 1A, a semiconductor layer 125' is formed over the semiconductor layer 124', in accordance with some embodiments. The semiconductor layer 125' is formed using an epitaxial process or a deposition process, such as a chemical vapor deposition process or a physical vapor deposition process, in accordance with some embodiments.

As shown in FIG. 1A, a semiconductor layer 126' is formed over the semiconductor layer 125', in accordance with some embodiments. The semiconductor layer 126' is formed using an epitaxial process or a deposition process, such as a chemical vapor deposition process or a physical vapor deposition process, in accordance with some embodiments.

As shown in FIG. 1A, a semiconductor layer 127' is formed over the semiconductor layer 126', in accordance with some embodiments. The semiconductor layer 127' is formed using an epitaxial process or a deposition process, such as a chemical vapor deposition process or a physical vapor deposition process, in accordance with some embodiments.

As shown in FIG. 1A, a semiconductor layer 128' is formed over the semiconductor layer 127', in accordance with some embodiments. The semiconductor layer 128' is formed using an epitaxial process or a deposition process, such as a chemical vapor deposition process or a physical vapor deposition process, in accordance with some embodiments.

The semiconductor layer 122' is thicker than the semiconductor layer 121', 123', 124', 125', 126', 127', or 128', in accordance with some embodiments. The semiconductor layer 121' or 123' is thinner than the semiconductor layer 124', 125', 126', 127', or 128', in accordance with some embodiments.

The semiconductor layers 121, 123', 125', and 127' are made of a same first material, in accordance with some embodiments. The first material is different from the material of the substrate 110, in accordance with some embodiments. The first material includes an elementary semiconductor material including silicon or germanium in a single crystal structure, a polycrystal structure, or an amorphous structure, in accordance with some embodiments.

The first material includes a compound semiconductor, such as silicon carbide, gallium arsenide, gallium phosphide, indium phosphide, indium arsenide, an alloy semiconductor, such as SiGe or GaAsP, or a combination thereof, in accordance with some embodiments.

The semiconductor layers 122', 124', 126', and 128' are made of a same second material, in accordance with some embodiments. The second material is different from the first material, in accordance with some embodiments. The second material is the same as the material of the substrate 110, in accordance with some embodiments.

The second material includes an elementary semiconductor material including silicon or germanium in a single crystal structure, a polycrystal structure, or an amorphous structure, in accordance with some embodiments. The second material includes a compound semiconductor, such as silicon carbide, gallium arsenide, gallium phosphide, indium phosphide, indium arsenide, an alloy semiconductor, such as SiGe or GaAsP, or a combination thereof, in accordance with some embodiments.

As shown in FIG. 1A, a mask layer 10 is formed over the semiconductor layer 128', in accordance with some embodiments. The mask layer 10 is made of a nitride-containing material, such as silicon nitride, a polymer material, such as a photoresist material, an oxide-containing material, such as silicon dioxide ($SiO_2$), or another suitable material, which is different from the materials of the semiconductor layers 121', 122', 123', 124', 125', 126', 127', and 128' and the substrate 110, in accordance with some embodiments.

The mask layer 10 is formed using a deposition process (e.g., a physical vapor deposition process or a chemical vapor deposition process), a photolithography process, and an etching process (e.g., a dry etching process), in accordance with some embodiments.

Figure 2A:
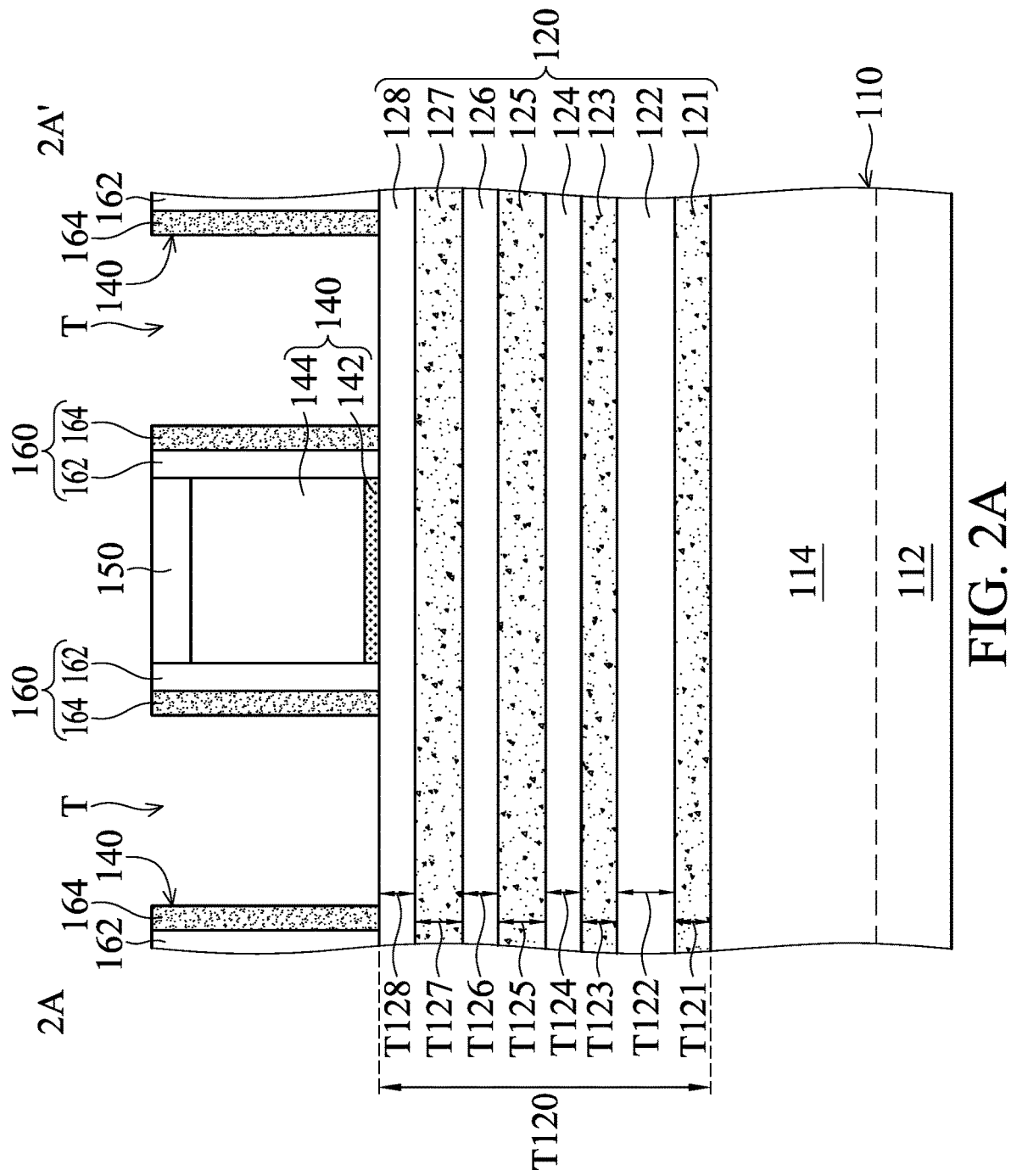
FIGS. 2A-2H are cross-sectional views of various stages of a process for forming a semiconductor device structure, in accordance with some embodiments.

FIG. 2A is a cross-sectional view illustrating the semiconductor device structure along a sectional line 2A-2A' in FIG. 1B, in accordance with some embodiments. As shown in FIGS. 1A, 1B and 2A, the semiconductor layers 121', 122', 123', 124', 125', 126', 127', and 128' and the substrate 110, which are not covered by the mask layer 10, are removed, in accordance with some embodiments.

The removal process forms trenches 111 in the substrate 110, in accordance with some embodiments. After the removal process, the remaining portion of the substrate 110 has a base 112 and a fin 114 over the base 112, in accordance with some embodiments. The fin 114 is between the trenches 111, in accordance with some embodiments.

After the removal process, the remaining semiconductor layers 121', 122', 123', 124', 125', 126', 127', and 128' respectively form nanostructures 121, 122, 123, 124, 125, 126, 127, and 128, in accordance with some embodiments. The nanostructures 121, 122, 123, 124, 125, 126, 127, and 128 together form a nanostructure stack 120, in accordance with some embodiments.

The nanostructure stack 120 is formed over the fin 114, in accordance with some embodiments. In some embodiments, as shown in FIG. 2A, a thickness T120 of the nanostructure stack 120 ranges from about 40 nm to about 80 nm.

The nanostructures 121, 122, 123, 124, 125, 126, 127, and 128 are sequentially stacked over the fin 114, in accordance with some embodiments. The nanostructures 121, 122, 123, 124, 125, 126, 127, and 128 include nanowires or nanosheets, in accordance with some embodiments.

The nanostructure 122 is thicker than the nanostructure 121, 123, 124, 125, 126, 127, or 128, in accordance with some embodiments. The nanostructure 121 or 123 is thinner than the nanostructure 125 or 127, in accordance with some embodiments. The nanostructure 122 is closer to the nanostructure 124 than the nanostructure 126, in accordance with some embodiments.

The nanostructure 121 has a thickness T121 ranging from about 1 nm to about 5 nm, in accordance with some embodiments. The nanostructure 122 has a thickness T122 ranging from about 7 nm to about 20 nm, in accordance with some embodiments. The nanostructure 123 has a thickness T123 ranging from about 1 nm to about 5 nm, in accordance with some embodiments. The nanostructure 124 has a thickness T124 ranging from about 4 nm to about 14 nm, in accordance with some embodiments. The nanostructure 125 has a thickness T125 ranging from about 4 nm to about 10 nm, in accordance with some embodiments.

The nanostructure 126 has a thickness T126 ranging from about 4 nm to about 14 nm, in accordance with some embodiments. The nanostructure 127 has a thickness T127 ranging from about 4 nm to about 10 nm, in accordance with some embodiments. The nanostructure 128 has a thickness T128 ranging from about 4 nm to about 14 nm, in accordance with some embodiments. The removal process includes an anisotropic etching process, such as a dry etching process (e.g., a plasma etching process), in accordance with some embodiments.

As shown in FIG. 1B, the mask layer 10 is removed, in accordance with some embodiments. As shown in FIG. 1B, an isolation layer 130 is formed over the base 112, in accordance with some embodiments. The fin 114 is partially embedded in the isolation layer 130, in accordance with some embodiments. The fin 114 is surrounded by the isolation layer 130, in accordance with some embodiments.

The isolation layer 130 is made of a dielectric material such as an oxide-containing material (e.g., silicon oxide), an oxynitride-containing material (e.g., silicon oxynitride), a low-k (low dielectric constant) material, a porous dielectric material, glass, or a combination thereof, in accordance with some embodiments. The glass includes borosilicate glass (BSG), phosphoric silicate glass (PSG), borophosphosilicate glass (BPSG), fluorinated silicate glass (FSG), or a combination thereof, in accordance with some embodiments.

The isolation layer 130 is formed using a deposition process (or a spin-on process), a chemical mechanical polishing process, and an etching back process, in accordance with some embodiments. The deposition process includes a chemical vapor deposition (CVD) process, a high density plasma chemical vapor deposition (HDPCVD) process, a flowable chemical vapor deposition (FCVD) process, a sputtering process, or a combination thereof, in accordance with some embodiments.

As shown in FIGS. 1B and 2A, gate stacks 140 are formed over the nanostructure stack 120, the fin 114, and the isolation layer 130, in accordance with some embodiments. For the sake of simplicity, FIG. 1B only shows one of the gate stacks 140, in accordance with some embodiments. As shown in FIG. 2A, trenches T are between the adjacent gate stacks 140 to separate the adjacent gate stacks 140 from one another, in accordance with some embodiments.

The nanostructures 121, 122, 123, 124, 125, 126, 127, and 128 pass through the gate stack 140, in accordance with some embodiments. Each gate stack 140 includes a gate dielectric layer 142 and a gate electrode 144, in accordance with some embodiments. The gate electrode 144 is over the gate dielectric layer 142, in accordance with some embodiments. The gate dielectric layer 142 is positioned between the gate electrode 144 and the nanostructure stack 120, in accordance with some embodiments.

The gate dielectric layer 142 is also positioned between the gate electrode 144 and the fin 114, in accordance with some embodiments. The gate dielectric layer 142 is positioned between the gate electrode 144 and the isolation layer 130, in accordance with some embodiments.

The gate dielectric layer 142 is made of an oxide-containing material such as silicon oxide, in accordance with some embodiments. The gate dielectric layer 142 is formed using a chemical vapor deposition process and an etching process, in accordance with some embodiments. The gate electrode 144 is made of a semiconductor material such as polysilicon, in accordance with some embodiments. The gate electrode 144 is formed using a chemical vapor deposition process and an etching process, in accordance with some embodiments.

As shown in FIGS. 1B and 2A, a mask layer 150 is formed over the gate stacks 140, in accordance with some embodiments. The mask layer 150 is made of a material different from the materials of the gate stacks 140, in accordance with some embodiments. The mask layer 150 is made of nitrides (e.g., silicon nitride) or oxynitride (e.g., silicon oxynitride), in accordance with some embodiments.

As shown in FIGS. 1B and 2A, a spacer structure 160 is formed over sidewalls 142a. 144a and 152 of the gate dielectric layer 142, the gate electrode 144 and the mask layer 150, in accordance with some embodiments. The spacer structure 160 surrounds the gate stack 140 and the mask layer 150, in accordance with some embodiments. The spacer structure 160 is positioned over the nanostructure stack 120, the fin 114 and the isolation layer 130, in accordance with some embodiments.

As shown in FIG. 2A, the spacer structure 160 includes spacer layers 162 and 164, in accordance with some embodiments. The spacer layer 162 is between the spacer layer 164 and the gate stack 140, in accordance with some embodiments. The spacer layer 162 is also between the spacer layer 164 and the mask layer 150, in accordance with some embodiments. The spacer layers 162 and 164 are made of different materials, in accordance with some embodiments.

The spacer layers 162 and 164 include insulating materials, such as silicon oxide, silicon nitride, silicon oxynitride, or silicon carbide, in accordance with some embodiments. The spacer layers 162 and 164 are made of materials different from that of the gate stack 140 and the mask layer 150, in accordance with some embodiments. The formation of the spacer layers 162 and 164 includes deposition processes and an anisotropic etching process, in accordance with some embodiments.

Figure 2B:
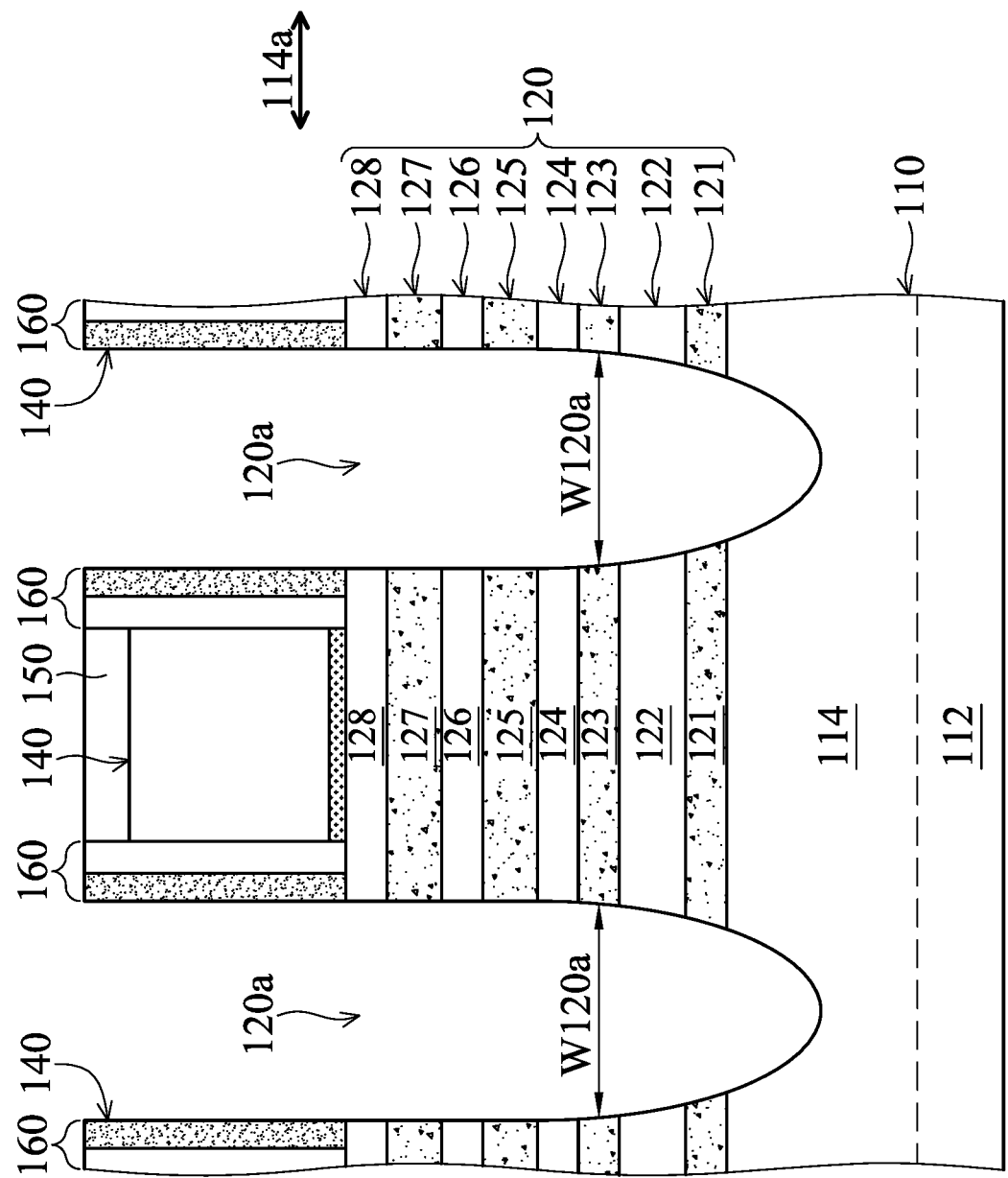

FIGS. 2A-2H are cross-sectional views of various stages of a process for forming a semiconductor device structure, in accordance with some embodiments. After the step of FIG. 2A, as shown in FIG. 2B, portions of the nanostructure stack 120, which are not covered by the gate stacks 140 and the spacer structure 160, are removed, in accordance with some embodiments. The removal process forms trenches 120a in the nanostructure stack 120 and the fin 114, in accordance with some embodiments.

Each trench 120a has a width W120a decreasing toward the fin 114, in accordance with some embodiments. The width W120a is measured along a longitudinal axis 114a of the fin 114, in accordance with some embodiments. The widths shown in FIGS. 2B and 2E are also measured along the longitudinal axis 114a of the fin 114, in accordance with some embodiments.

The removal process includes an etching process, in accordance with some embodiments. The etching process includes an anisotropic etching process such as a dry etching process, in accordance with some embodiments.

Figure 2C:
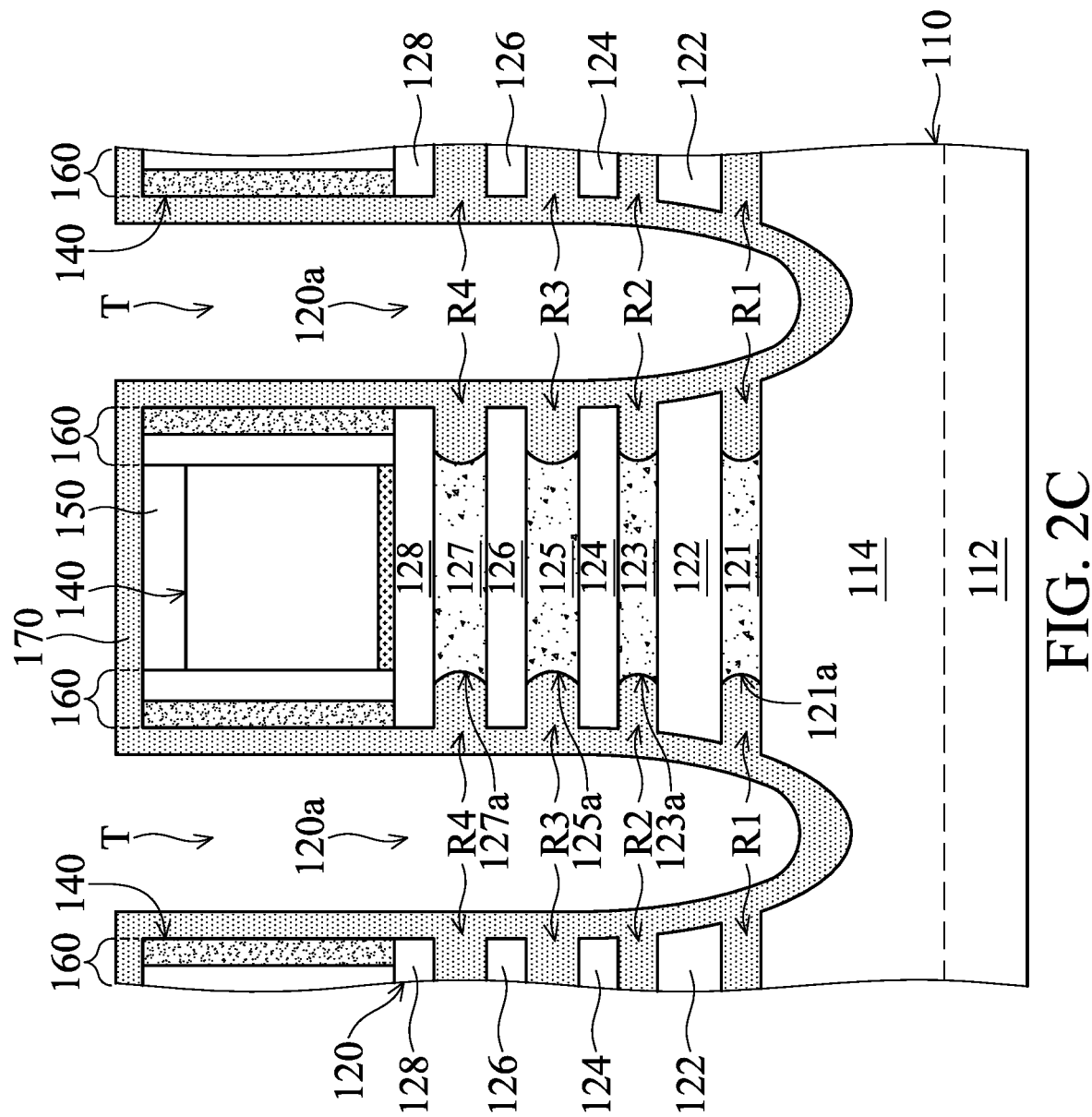

As shown in FIG. 2C, end portions of the nanostructures 121, 123, 125 and 127 are removed through the trenches 120a and T, in accordance with some embodiments. The removal process forms recesses R1, R2, R3 and R4 in the nanostructure stack 120, in accordance with some embodiments. The recess R1 is between the fin 114 and the nanostructure 122, in accordance with some embodiments. The recess R2 is between the nanostructures 122 and 124, in accordance with some embodiments. The recess R3 is between the nanostructures 124 and 126, in accordance with some embodiments. The recess R4 is between the nano-structures 126 and 128, in accordance with some embodiments. The removal process includes an etching process such as a dry etching process or a wet etching process, in accordance with some embodiments.

As shown in FIG. 2C, an inner spacer material layer 170 is formed over the mask layer 150, the spacer structure 160, the nanostructure stack 120 and the fin 114, in accordance with some embodiments. The recesses R1, R2, R3 and R4 are filled with the inner spacer material layer 170, in accordance with some embodiments. The inner spacer material layer 170 is in direct contact with sidewalls 121a, 123a, 125a and 127a of the nanostructures 121, 123, 125 and 127, in accordance with some embodiments.

The inner spacer material layer 170 is made of an insulating material, such as an oxide-containing material (e.g., silicon oxide), a nitride-containing material (e.g., silicon nitride), an oxynitride-containing material (e.g., silicon oxynitride), a carbide-containing material (e.g., silicon carbide), a high-k material (e.g., $HfO_2$, $ZrO_2$, $HfZrO_2$, or $Al_2O_3$), or a low-k material, in accordance with some embodiments.

The term "high-k material" means a material having a dielectric constant greater than the dielectric constant of silicon dioxide, in accordance with some embodiments. The term "low-k material" means a material having a dielectric constant less than the dielectric constant of silicon dioxide, in accordance with some embodiments. The inner spacer material layer 170 is formed using a deposition process such as a physical vapor deposition process, a chemical vapor deposition process, an atomic layer deposition process, or the like, in accordance with some embodiments.

Figure 2D:
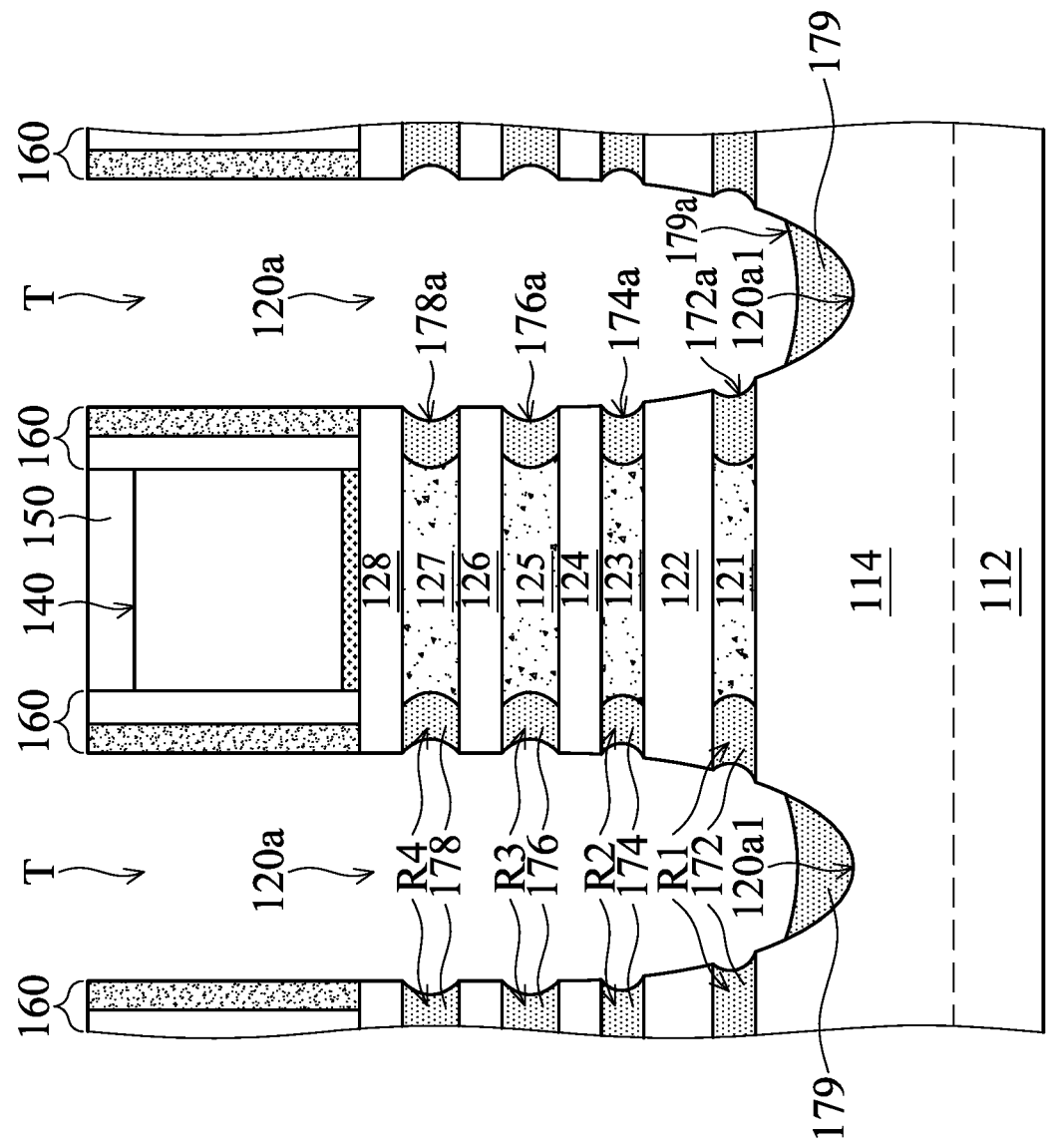
Figure 2E:
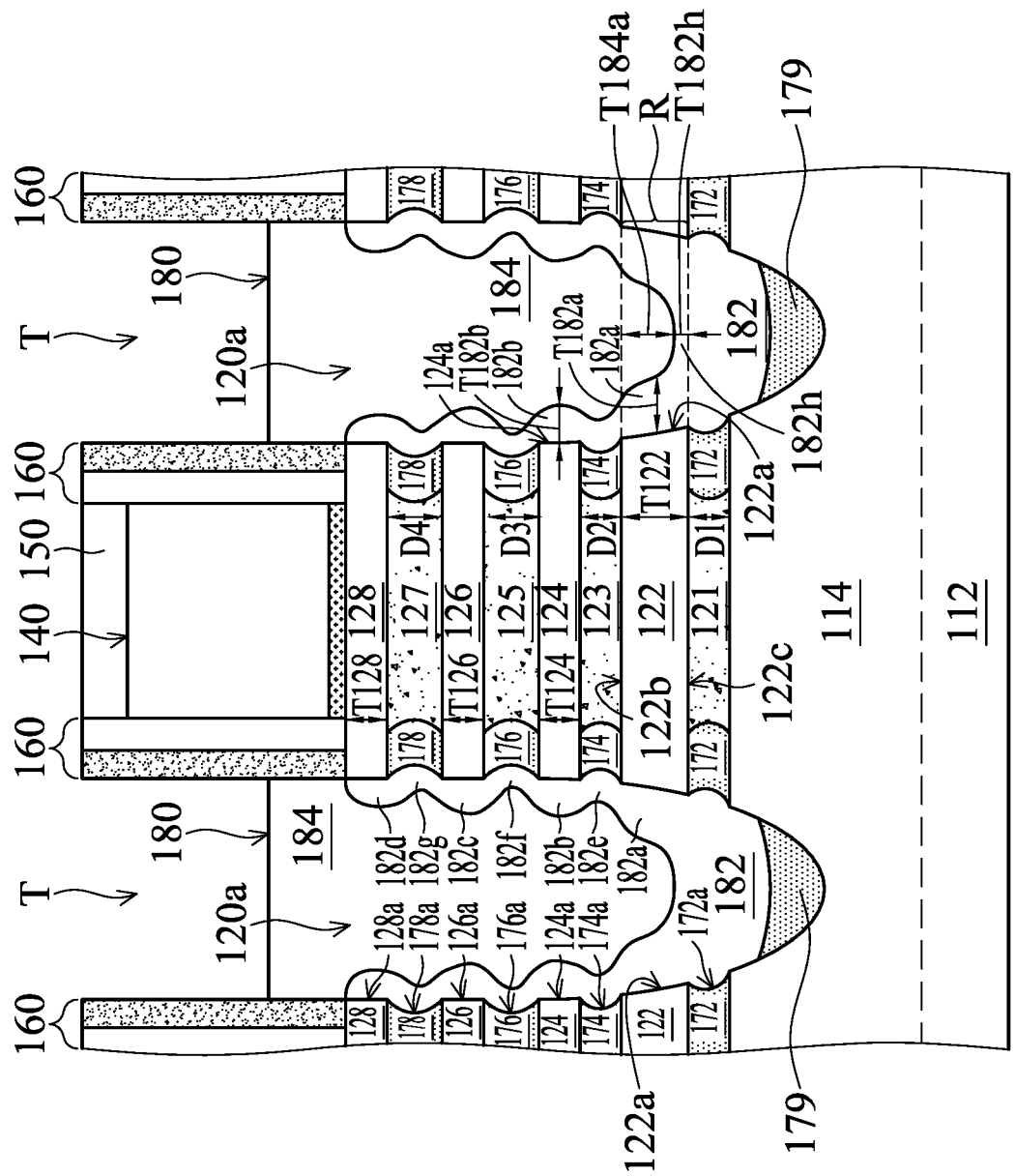

As shown in FIG. 2D, the portions of the inner spacer material layer 170 outside of the recesses R1, R2, R3 and R4 are partially removed, in accordance with some embodiments. The remaining inner spacer material layer 170 includes inner spacers 172, 174, 176 and 178 and an insulating layer 179, in accordance with some embodiments. The inner spacers 172, 174, 176 and 178 are in the recesses R1, R2, R3 and R4 respectively, in accordance with some embodiments. The insulating layer 179 is over a bottom surface 120al of each trench 120a, in accordance with some embodiments.

In some embodiments, sidewalls 172a, 174a, 176a, and 178a of the inner spacers 172, 174, 176, and 178 are concave curved surfaces, in accordance with some embodiments. The bottom surface 120al is a concave curved surface, in accordance with some embodiments. In some embodiments, a top surface 179a of the insulating layer 179 is a concave curved surface, in accordance with some embodiments.

As shown in FIG. 2E, a lightly doped layer 182 is formed in the trenches 120a and over the insulating layer 179, in accordance with some embodiments. The lightly doped layer 182 covers sidewalls 122a, 124a, 126a, 128a, 172a, 174a, 176a, and 178a of the nanostructures 122, 124, 126, and 128 and the inner spacers 172, 174, 176, and 178, in accordance with some embodiments.

The lightly doped layer 182 is in direct contact with the nanostructures 122, 124, 126 and 128, the inner spacers 172, 174, 176 and 178, and the substrate 110, in accordance with some embodiments. The lightly doped layer 182 is formed using an epitaxial process, in accordance with some embodiments.

Since the lightly doped layer 182 epitaxially grows from semiconductor surfaces of the fin 114 and the nanostructures 122, 124, 126, and 128, the lightly doped layer 182 has thick portions 182a, 182b, 182c, and 182d, which respectively grow from the nanostructures 122, 124, 126, and 128, in accordance with some embodiments.

Since the lightly doped layer 182 does not grow from the inner spacers 174, 176, and 178, the lightly doped layer 182 has thin merge portions 182c, 182f, and 182g, which are respectively connected to the inner spacers 174, 176, and 178, in accordance with some embodiments. The thick portion 182a, 182b, 182c, or 182d is thicker than the thin merge portion 182e, 182f, or 182g, in accordance with some embodiments.

As shown in FIG. 2E, a heavily doped structure 184 is formed over the lightly doped layer 182, in accordance with some embodiments. The lightly doped layer 182 and the heavily doped structure 184 are doped with the same dopant, in accordance with some embodiments.

The lightly doped layer 182 separates the heavily doped structure 184 from the nanostructures 122, 124, 126, and 128 and the fin 114, in accordance with some embodiments. The lightly doped layer 182 surrounds a lower portion of the heavily doped structure 184, in accordance with some embodiments. The lightly doped layer 182 and the heavily doped structure 184 in the same trench 120a together form a stressor structure 180, in accordance with some embodiments. The stressor structures 180 are also referred to as source/drain structures, in accordance with some embodiments.

In some embodiments, a concentration of the dopant in the lightly doped layer 182 is less than a concentration of the dopant in the heavily doped structure 184. The concentration of the dopant in the lightly doped layer 182 is greater than the concentration of the dopant in the fin 114 and less than the concentration of the dopant in the heavily doped structure 184, in accordance with some embodiments. Therefore, the lattice constant of the lightly doped layer 182 is between the lattice constant of the fin 114 and the lattice constant of the heavily doped structure 184, in accordance with some embodiments. The formation of the lightly doped layer 182 helps the heavily doped structure 184 epitaxially grow over the fin 114, in accordance with some embodiments.

If the stressor structure 180 is used as a stressor structure of a p-channel field effect transistor (pFET), the dopant includes an element, which is larger than silicon, in accordance with some embodiments. The element includes germanium (Ge), in accordance with some embodiments. Since the element is larger than silicon, the stressor structures 180 are able to provide a compressive stress to the nanostructures 122, 124, 126 and 128 so as to improve the channel property of the nanostructures 122, 124, 126 and 128, in accordance with some embodiments.

The germanium concentration of the lightly doped layer 182 is less than the germanium concentration of the heavily doped structure 184, in accordance with some embodiments. In some embodiments, a germanium concentration ratio of the heavily doped structure 184 to the lightly doped layer 182 ranges from about 1.5 to about 2.5.

The germanium concentration of the lightly doped layer 182 ranges from about 15 at. % to about 30 at. % (atomic percent), in accordance with some embodiments. The germanium concentration of the heavily doped structure 184 ranges from about 35 at. % to about 55 at. % (atomic percent), in accordance with some embodiments.

If the stressor structure 180 is used as a stressor structure of an n-channel field effect transistor (nFET), the dopant includes an element, which is smaller than silicon, in accordance with some embodiments. The element includes carbon (C), in accordance with some embodiments. Since the element is smaller than silicon, the stressor structures 180 are able to provide a tensile stress to the nanostructures 122, 124, 126 and 128 so as to improve the channel property of the nanostructures 122, 124, 126 and 128, in accordance with some embodiments.

The carbon concentration of the lightly doped layer 182 is less than the carbon concentration of the heavily doped structure 184, in accordance with some embodiments. In some embodiments, a carbon concentration ratio of the heavily doped structure 184 to the lightly doped layer 182 ranges from about 1.5 to about 2.5.

The carbon concentration of the lightly doped layer 182 ranges from about 0.1 at. % to about 10 at. % (atomic percent), in accordance with some embodiments. In some other embodiments, the lightly doped layer 182 has no carbon. The carbon concentration of the heavily doped structure 184 ranges from about 10 at. % to about 20 at. % (atomic percent), in accordance with some embodiments.

Since the concentration of the dopant in the heavily doped structure 184 is greater than the concentration of the dopant in the lightly doped layer 182, the heavily doped structure 184 is able to provide more stress to the nanostructures 122, 124, 126 and 128 than the lightly doped layer 182, in accordance with some embodiments. Therefore, if the lateral overlap area between the nanostructures 122, 124, 126 and 128 and the heavily doped structures 184 is increased, the heavily doped structures 184 is able to provide more stress to the nanostructures 122, 124, 126 and 128.

Since the application increases the thickness T122 of the nanostructure 122, the height of the nanostructure 122 is increased, which increases the lateral overlap area between the nanostructure 122 and the heavily doped structures 184, in accordance with some embodiments. Therefore, the stress applied to the nanostructure 122 from the heavily doped structures 184 is increased, in accordance with some embodiments. As a result, the channel property of the nanostructure 122 is improved (or boosted), in accordance with some embodiments.

In some embodiments, a region R of the stressor structure 180 is lower than a top surface 122b of the nanostructure 122 and higher than a bottom surface 122c of the nanostructure 122. In the region R, the heavily doped structure 184 is thicker than a portion 182h of the lightly doped layer 182 under the heavily doped structure 184, in accordance with some embodiments. That is, in the region R, the thickness T184a of the heavily doped structure 184 is greater than the thickness T182h of the portion 182h of the lightly doped layer 182, in accordance with some embodiments.

In the region R of the stressor structure 180, the thick portion 182a of the lightly doped layer 182 between the heavily doped structure 184 and the nanostructure 122 is thicker than the portion 182h of the lightly doped layer 182 under the heavily doped structure 184, in accordance with some embodiments.

The thick portions 182a and 182b of the lightly doped layer 182 respectively cover the sidewalls 122a and 124a of the nanostructures 122 and 124, in accordance with some embodiments. The thick portion 182a is thicker than the thick portion 182b, in accordance with some embodiments.

In some embodiments, a ratio of the thickness T122 of the nanostructure 122 to the thickness T124, T126, or T128 of the nanostructure 124, 126, or 128 ranges from about 1.5 to about 2. If the ratio (T122/T124) is less than 1.5, the lateral overlap area between the nanostructure 122 and the heavily doped structures 184 is not large enough to improve the channel property of the nanostructure 122, in accordance with some embodiments. If the ratio (T122/T124) is greater than 2, the nanostructure 122 is too thick to latch the channel of the nanostructure 122, in accordance with some embodiments.

Since the application increases the thickness T122 of the nanostructure 122, a distance D1 between the nanostructure 122 and the fin 114 and the distance D2 between the nanostructures 122 and 124 are both decreased, in accordance with some embodiments. In some embodiments, the distance D1 or D2 is less than a distance D3 between the nanostructures 124 and 126. The distance D1 or D2 is less than the distance D4 between the nanostructures 126 and 128, in accordance with some embodiments.

Since the distance D1 is decreased, the thick portion 182a of the lightly doped layer 182, which epitaxially grows from the sidewall 122a of the nanostructure 122, easily merges with the lightly doped layer 182, which epitaxially grows from the fin 114, in accordance with some embodiments.

Since the distance D2 is decreased, the thick portion 182a of the lightly doped layer 182 easily merges with the thick portion 182b of the lightly doped layer 182, which epitaxially grows from the sidewall 124a of the nanostructure 124, in accordance with some embodiments.

As a result, the increase in the thickness T122 of the nanostructure 122 decreases the distances D1 and D2, which helps the epitaxial growth of the lightly doped layer 182, in accordance with some embodiments.

The distance D1 is substantially equal to the distance D2, in accordance with some embodiments. The thickness T122, T124, T126, or T128 of the nanostructure 122, 124, 126, or 128 is greater than the distance D1, D2, D3, or D4, in accordance with some embodiments.

If the stressor structures 180 are used as stressor structures of a p-channel field effect transistor (pFET), the stressor structures 180 are made of a semiconductor material (e.g., silicon germanium) with P-type dopants, such as the Group IIIA element, in accordance with some embodiments. The Group IIIA element includes boron or another suitable material.

If the stressor structures 180 are used as stressor structures of a n-channel field effect transistor (nFET), the stressor structures 180 are made of a semiconductor material (e.g., silicon or silicon carbide) with N-type dopants, such as the Group VA element, in accordance with some embodiments. The Group VA element includes phosphor (P), antimony (Sb), or another suitable Group VA material.

Figure 2F:
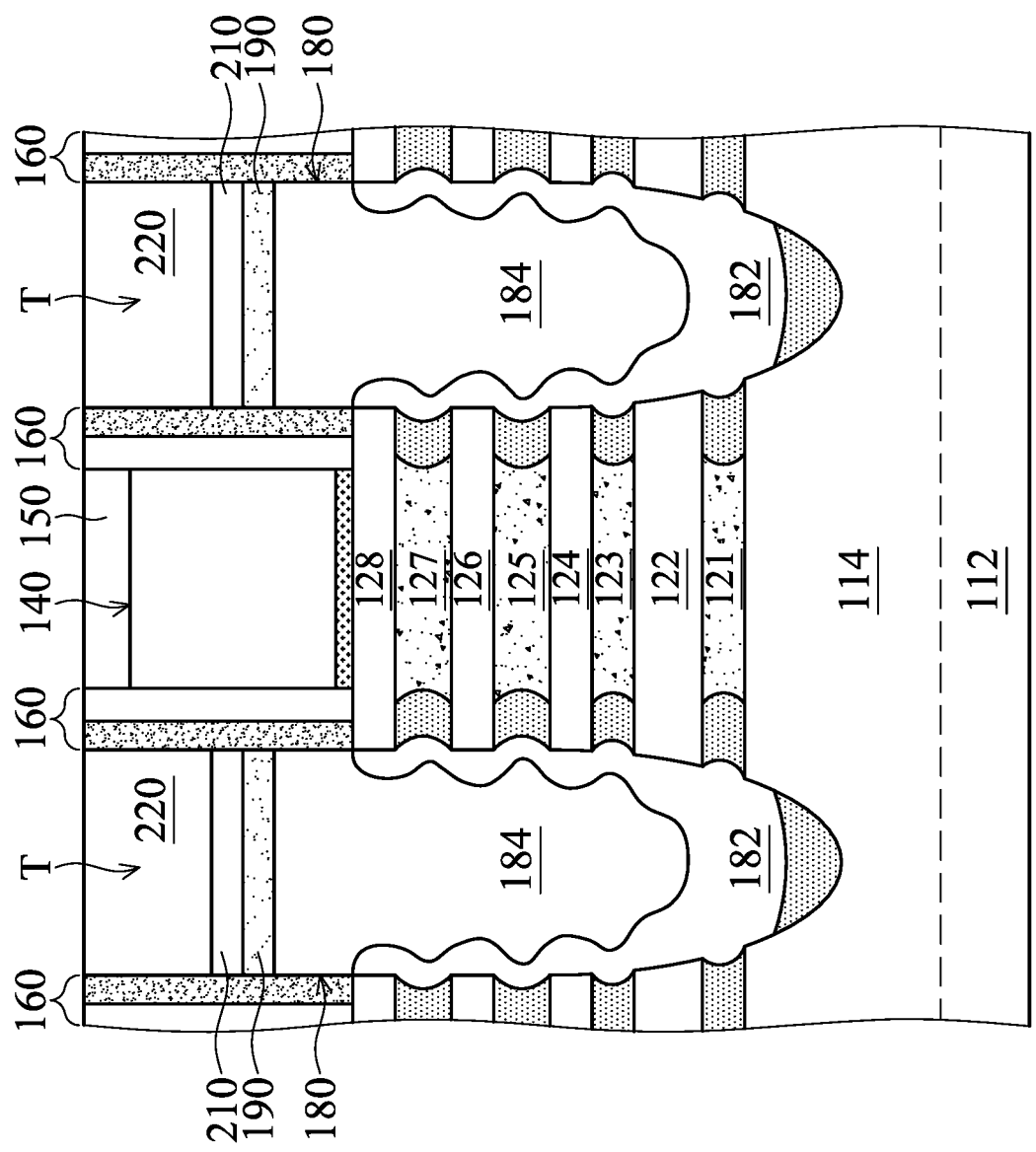

As shown in FIG. 2F, a cap layer 190 is formed over the stressor structures 180, in accordance with some embodiments. The cap layer 190 is doped with the dopant, which is the same as the dopant in the lightly doped layer 182 and the heavily doped structure 184, in accordance with some embodiments.

The dopant concentration of the cap layer 190 is greater than the dopant concentration of the heavily doped structure 184, in accordance with some embodiments. The cap layer 190 is used to prevent the dopant in the heavily doped structure 184 from diffusing into a dielectric layer, which is formed over the cap layer 190 in a subsequent process, in accordance with some embodiments.

In some embodiments, the dopant includes germanium (Ge) or carbon (C). The dopant concentration of the cap layer 190 ranges from about 55 at. % to about 70 at. % (atomic percent), in accordance with some embodiments. The cap layer 190 includes a semiconductor material, such as silicon, in accordance with some embodiments. The cap layer 190 is made of silicon germanium or silicon carbide, in accordance with some embodiments.

As shown in FIG. 2F, a protection layer 210 is formed over the cap layer 190, in accordance with some embodiments. The protection layer 210 is used to prevent the dopant in the cap layer 190 and the heavily doped structure 184 from diffusing into the dielectric layer, which is formed over the protection layer 210 in the subsequent process, in accordance with some embodiments. The protection layer 210 is made of a semiconductor material, such as pure silicon, in accordance with some embodiments.

As shown in FIG. 2F, a dielectric layer 220 is formed over the protection layer 210, in accordance with some embodiments. The dielectric layer 220 includes a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric layer 220 is formed by a deposition process (e.g., a chemical vapor deposition process) and a planarization process (e.g., a chemical mechanical polishing process), in accordance with some embodiments.

Figure 2G:
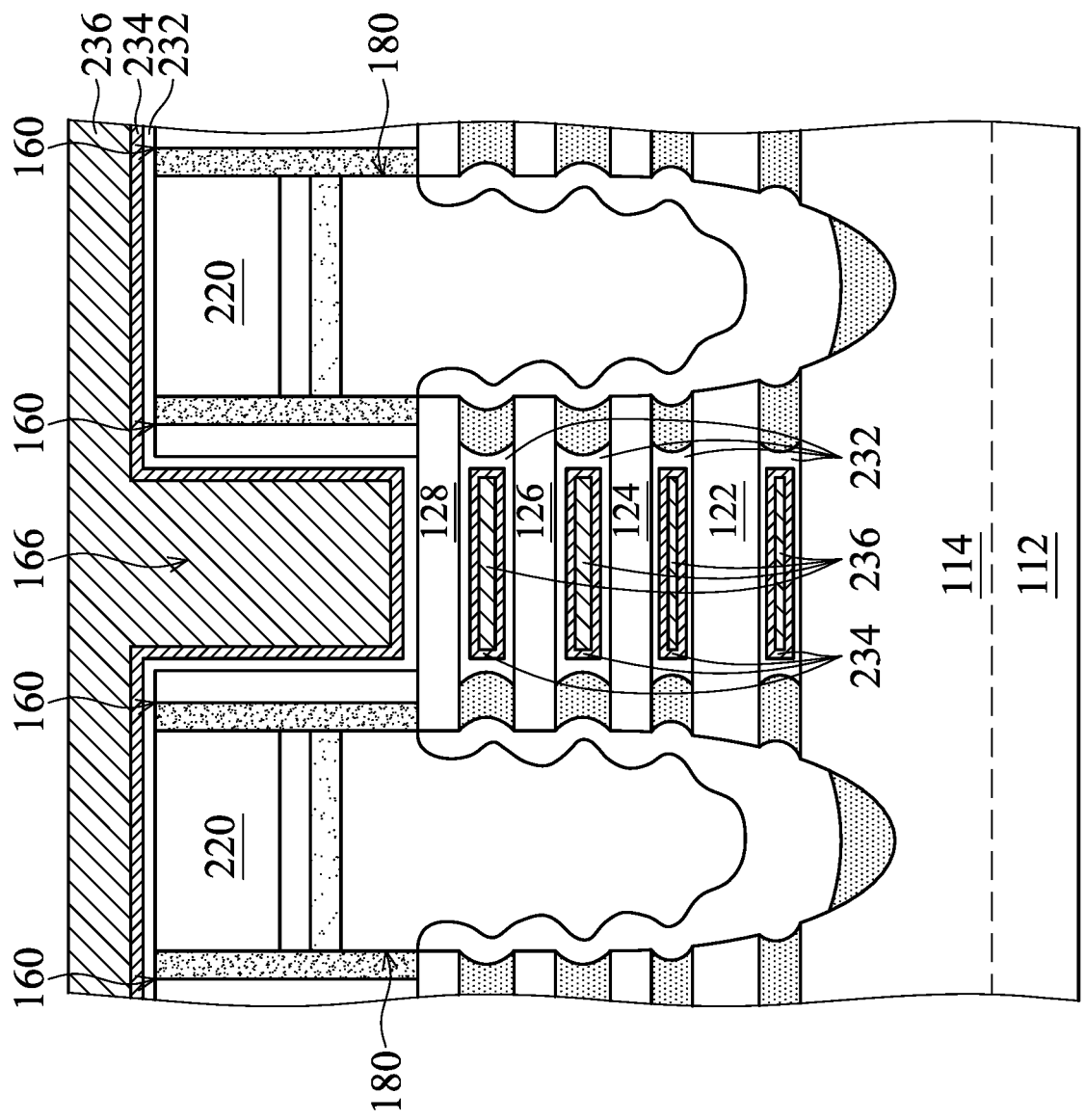

As shown in FIGS. 2F and 2G, the gate stacks 140 and the mask layer 150 are removed, in accordance with some embodiments. The removal process forms a trench 166 in the spacer structure 160, in accordance with some embodiments. As shown in FIGS. 2F and 2G, the nanostructures 121, 123, 125 and 127 are removed through the trench 166, in accordance with some embodiments. The removal process for removing the gate stacks 140, the mask layer 150 and the nanostructures 121, 123, 125 and 127 includes an etching process such as a wet etching process or a dry etching process, in accordance with some embodiments.

As shown in FIG. 2G, a gate dielectric layer 232 is formed over the dielectric layer 220, the spacer structure 160, the fin 114, and the nanostructures 122, 124, 126 and 128, in accordance with some embodiments. The gate dielectric layer 232 conformally covers the nanostructures 122, 124, 126 and 128 and inner walls and a bottom surface of the trench 166, in accordance with some embodiments.

The gate dielectric layer 232 is made of a high-K material, such as $HfO_2$, $ZrO_2$, $HfZrO_2$, or $Al_2O_3$. The gate dielectric layer 232 is formed using an atomic layer deposition process or another suitable process.

As shown in FIG. 2G, a work function metal layer 234 is formed over the gate dielectric layer 232, in accordance with some embodiments. The work function metal layer 234 is conformally formed over the gate dielectric layer 232, in accordance with some embodiments. The work function metal layer 234 is made of TiN, TaN, TiSiN, or another suitable conductive material. The work function metal layer 234 is formed using an atomic layer deposition process or another suitable process.

As shown in FIG. 2G, a gate electrode layer 236 is formed over the work function metal layer 234, in accordance with some embodiments. The gate electrode layer 236 is made of W, Co, Al, or another suitable conductive material. The gate electrode layer 236 is formed using an atomic layer deposition process or another suitable process.

Figure 2H:
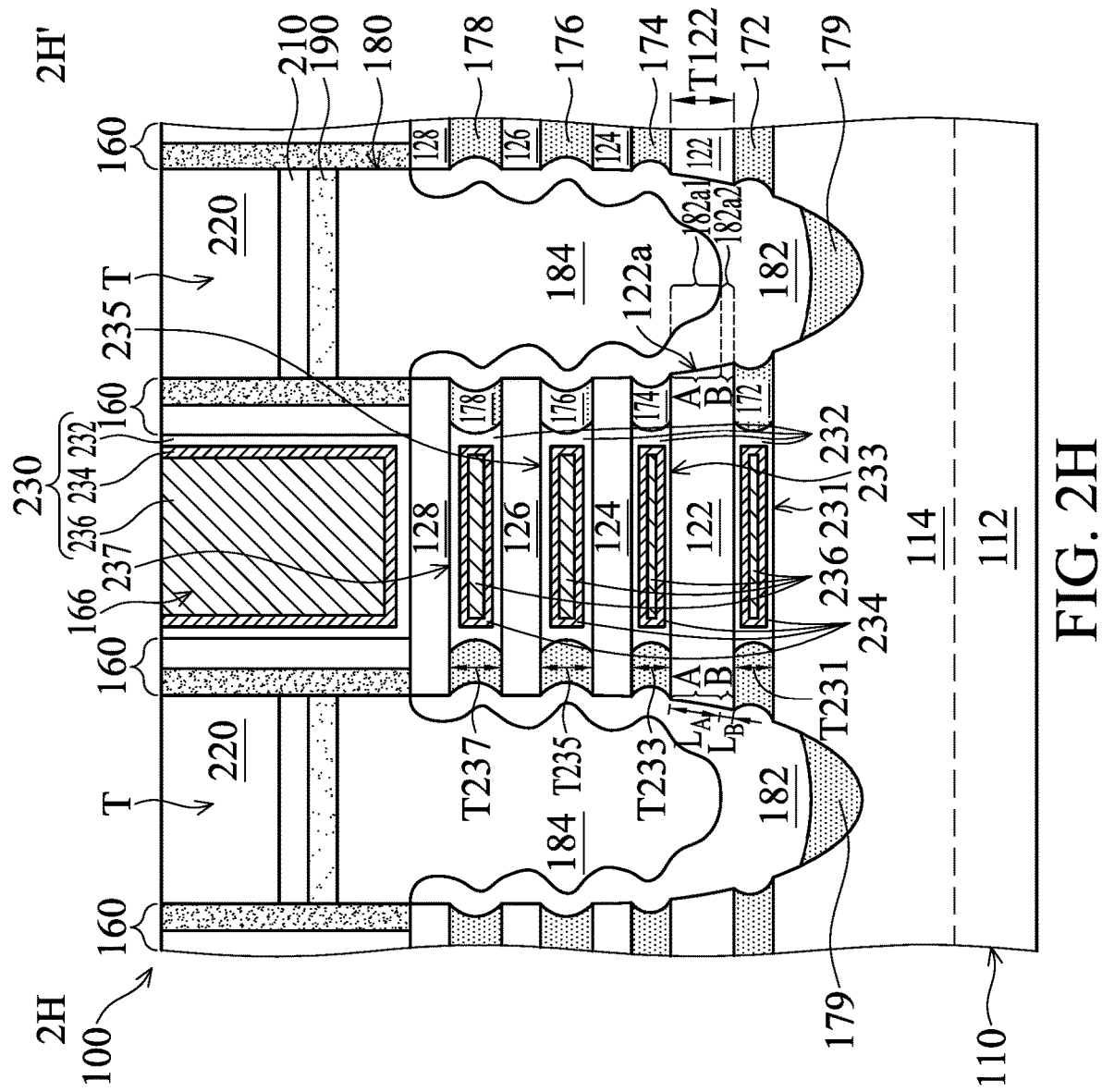
Figures 1, 2H:
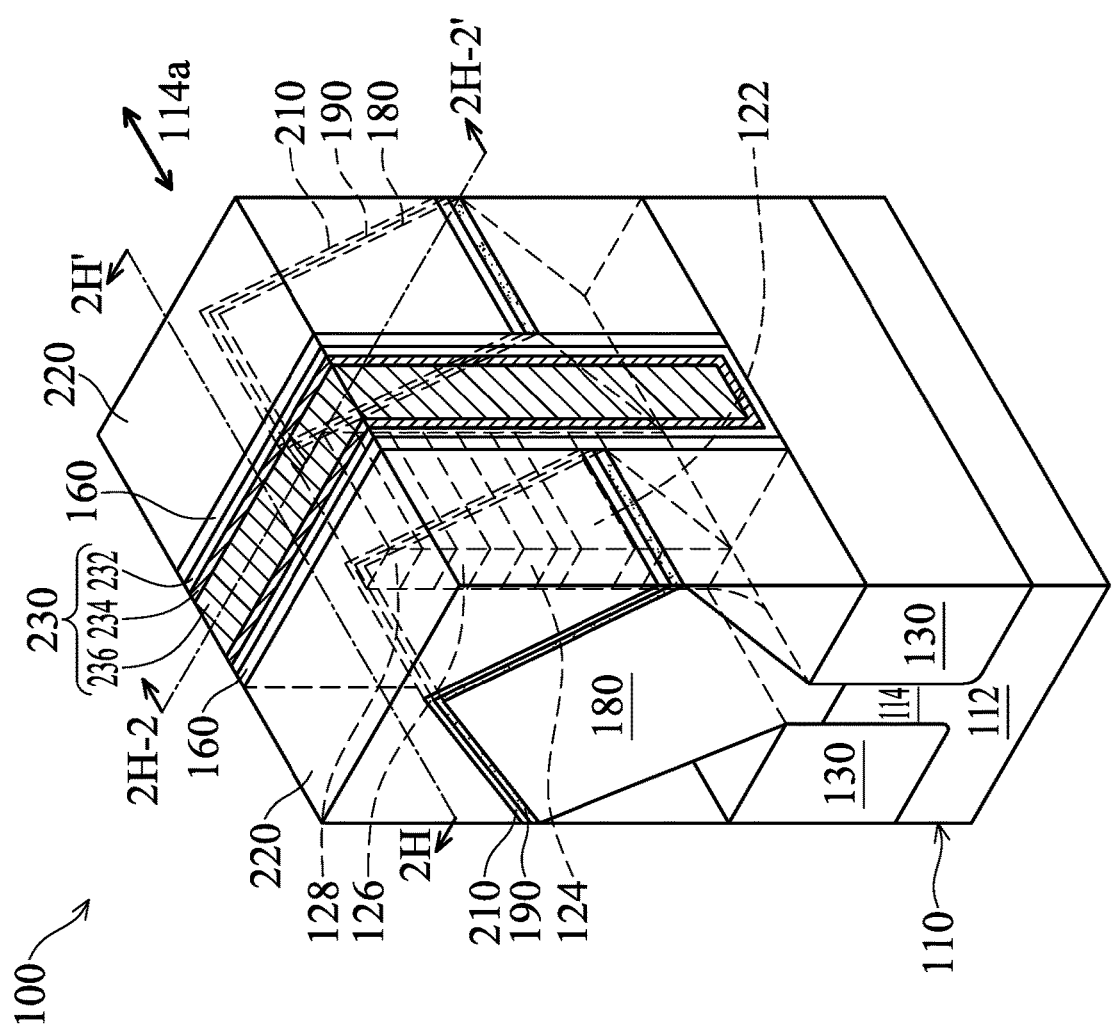
Figures 2, 2H:
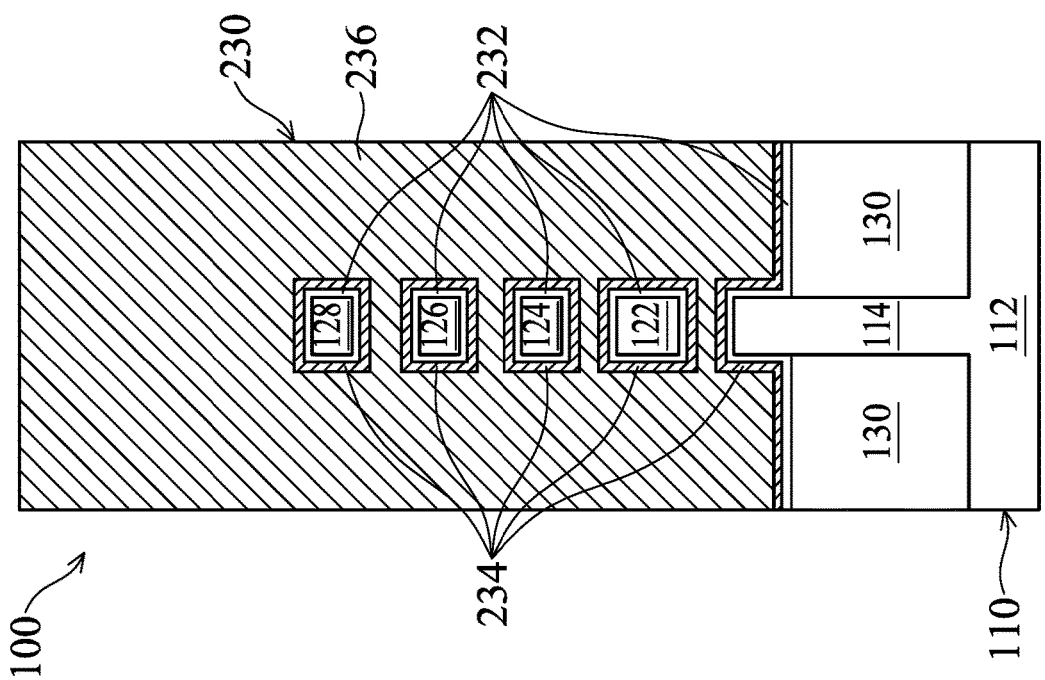

FIG. 2H-1 is a perspective view of the semiconductor device structure of FIG. 2H, in accordance with some embodiments. FIG. 2H is a cross-sectional view illustrating the semiconductor device structure along a sectional line 2H-2H' in FIG. 2H-1, in accordance with some embodiments. FIG. 2H-2 is a cross-sectional view illustrating the semiconductor device structure along a sectional line 2H-2-2H-2' in FIG. 2H-1, in accordance with some embodiments.

As shown in FIGS. 2H, 2H-1, and 2H-2, the gate dielectric layer 232, the work function metal layer 234, and the gate electrode layer 236 outside of the trench 166 are removed, in accordance with some embodiments. The removal process includes a chemical mechanical polishing process, in accordance with some embodiments.

After the removal process, the gate dielectric layer 232, the work function metal layer 234, the gate electrode layer 236 remaining in the same trench 166 together form a gate stack 230, in accordance with some embodiments. In this step, a semiconductor device structure 100 is substantially formed, in accordance with some embodiments. As shown in FIG. 2H-2, the gate stack 230 surrounds the nanostructures 122, 124, 126 and 128, in accordance with some embodiments.

As shown in FIG. 2H, the gate stack 230 has portions 231, 233, 235, and 237, in accordance with some embodiments. The portion 231 is between and in direct contact with the nanostructure 122 and the fin 114, in accordance with some embodiments. The portion 233 is between and in direct contact with the nanostructures 122 and 124, in accordance with some embodiments.

The portion 235 is between and in direct contact with the nanostructures 124 and 126, in accordance with some embodiments. The portion 237 is between and in direct contact with the nanostructures 126 and 128, in accordance with some embodiments.

The portions 231, 233, 235, and 237 respectively have thicknesses T231, T233, T235, and T237, in accordance with some embodiments. The portion 231 or 233 is thinner than the portion 235 or 237, in accordance with some embodiments. That is, the thickness T231 or T233 is less than the thickness T235 or T237, in accordance with some embodiments.

The portions 231 and 233 have a substantially same thickness, in accordance with some embodiments. That is, the thicknesses T231 is substantially equal to the thicknesses T233, in accordance with some embodiments. The portions 235 and 237 have a substantially same thickness, in accordance with some embodiments. That is, the thicknesses T235 is substantially equal to the thicknesses T237, in accordance with some embodiments. The portion 235 is closer to the portion 233 than the portion 231, in accordance with some embodiments.

The nanostructures 122, 124, 126 and 128 pass through the gate stack 230, in accordance with some embodiments. The nanostructure 122 is wider than the nanostructure 124, in accordance with some embodiments.

The stressor structure 180 adjacent to the nanostructure 122 is narrower than the stressor structure 180 adjacent to the nanostructure 124, in accordance with some embodiments. The fin 114 and the nanostructures 122, 124, 126 and 128 are spaced apart from each other, in accordance with some embodiments.

The portion 182*al* of the lightly doped layer 182 is between the heavily doped structure 184 and the nanostructure 122, in accordance with some embodiments. The portion 182*al* covers an upper portion A of the sidewall 122*a* of the nanostructure 122, in accordance with some embodiments.

In some embodiments, a lower portion B of the sidewall 122*a* is covered by a portion 182*a*2 of the lightly doped layer 182, which is not between the heavily doped structure 184 and the nanostructure 122. The upper portion A is greater than the lower portion B, in accordance with some embodiments. For example, the length LA of the upper portion A is greater than the length $L_B$ of the lower portion B.

Since the thickness T122 of the nanostructure 122 is increased, the upper portion A is enlarged, in accordance with some embodiments. The stress from the heavily doped structure 184 is laterally applied to the upper portion A of the sidewall 122*a* of the nanostructure 122, in accordance with some embodiments. Therefore, the increase in the thickness T122 of the nanostructure 122 increases the stress applied to nanostructure 122 from the heavily doped structure 184, in accordance with some embodiments. As a result, the channel property of the nanostructure 122 is improved or boosted, in accordance with some embodiments. Therefore, the performance of the semiconductor device structure 100 is improved or boosted, in accordance with some embodiments.

Figure 3:
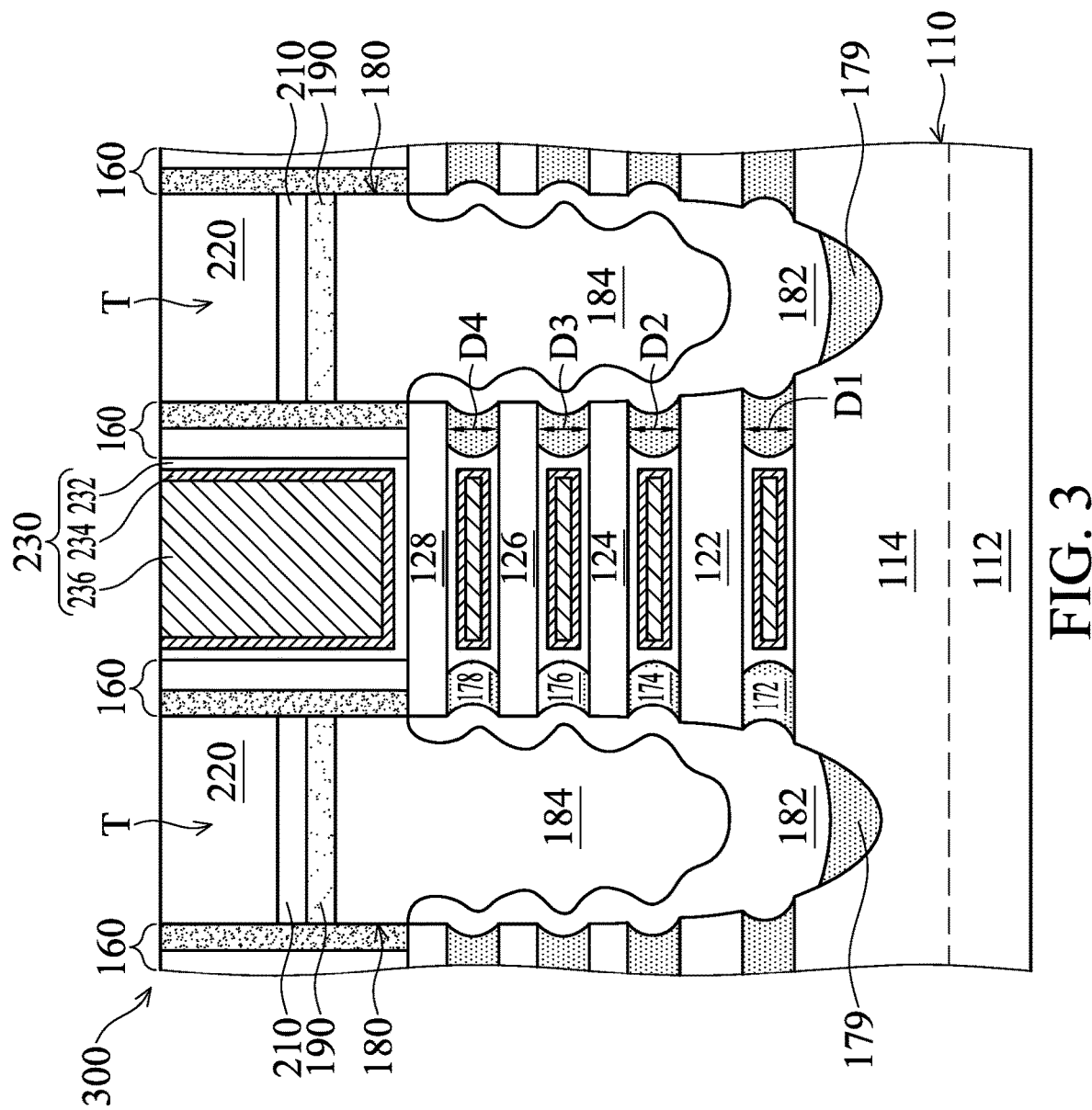
FIG. 3 is a cross-sectional view of a semiconductor device structure, in accordance with some embodiments.

FIG. 3 is a cross-sectional view of a semiconductor device structure 300, in accordance with some embodiments. As shown in FIG. 3, the semiconductor device structure 300 is similar to the semiconductor device structure 100 of FIG. 2H, except that the distance D1 between the nanostructure 122 and the fin 114, the distance D2 between the nanostructures 122 and 124, the distance D3 between the nanostructures 124 and 126, and the distance D4 between the nanostructures 126 and 128 are substantially equal to each other, in accordance with some embodiments.

Figure 4A:
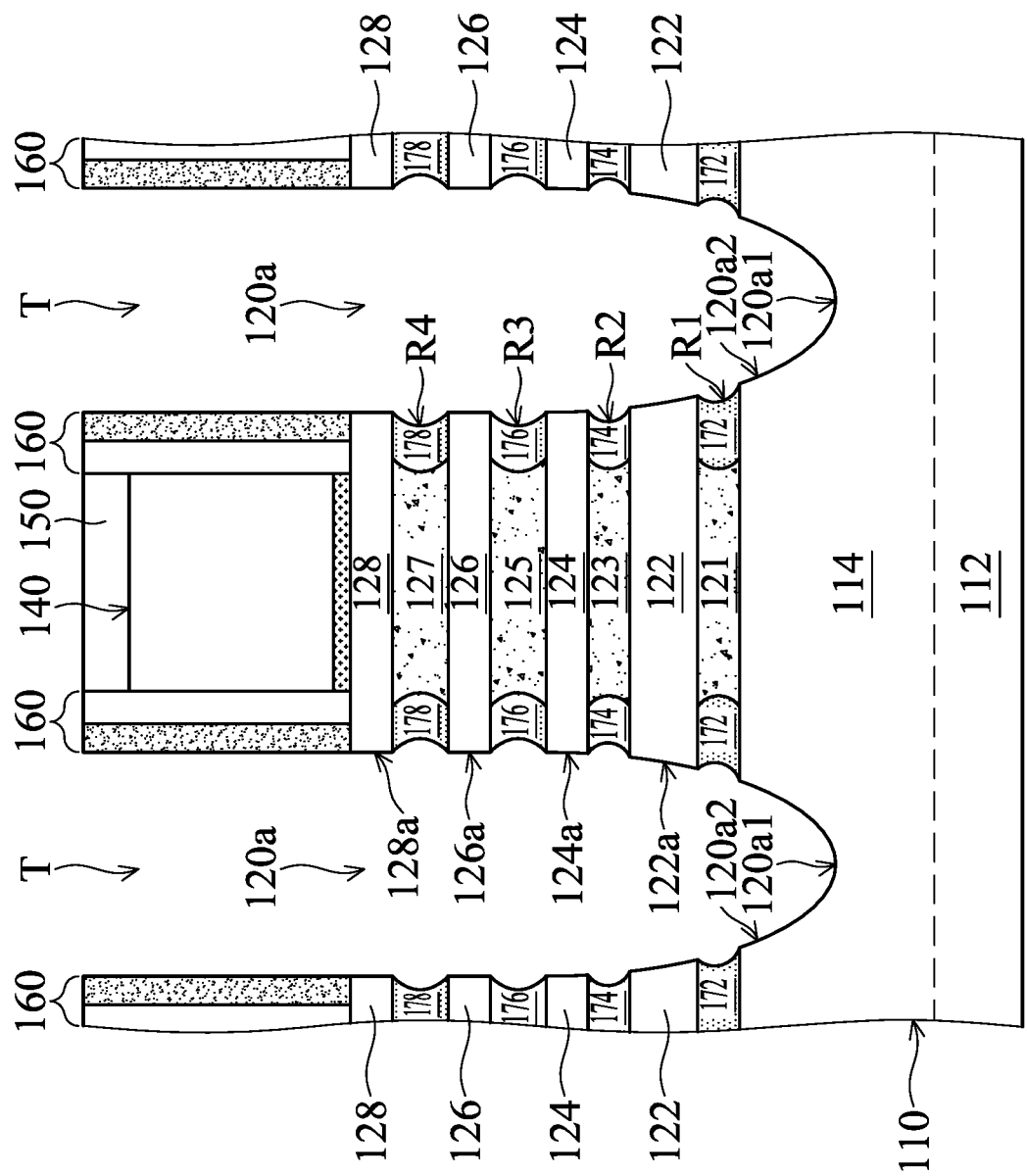
FIGS. 4A-4D are cross-sectional views of various stages of a process for forming a semiconductor device structure, in accordance with some embodiments.

FIGS. 4A-4D are cross-sectional views of various stages of a process for forming a semiconductor device structure, in accordance with some embodiments. After the step of FIG. 2C, as shown in FIG. 4A, the portions of the inner spacer material layer 170 outside of the recesses R1, R2, R3 and R4 are partially removed, in accordance with some embodiments. The remaining inner spacer material layer 170 includes inner spacers 172, 174, 176 and 178 but no insulating layer 179, in accordance with some embodiments.

After the removal process, the bottom surface 120*al* of each trench 120*a* is exposed, in accordance with some embodiments. The bottom surface 120*al* is a (100) surface, in accordance with some embodiments. The (100) surface is a (100) surface crystal orientation of the material (e.g., Si) of the substrate 110, in accordance with some embodiments.

In some embodiments, inner walls 120*a*2 of each trench 120*a* are (110) surfaces, in accordance with some embodiments. The inner walls 120*a*2 include the sidewalls 122*a*, 124*a*, 126*a*, and 128*a* of the nanostructures 122, 124, 126, and 128, in accordance with some embodiments. The (110) surface is a (110) surface crystal orientation of the material (e.g., Si) of the substrate 110, in accordance with some embodiments.

Figure 4B:
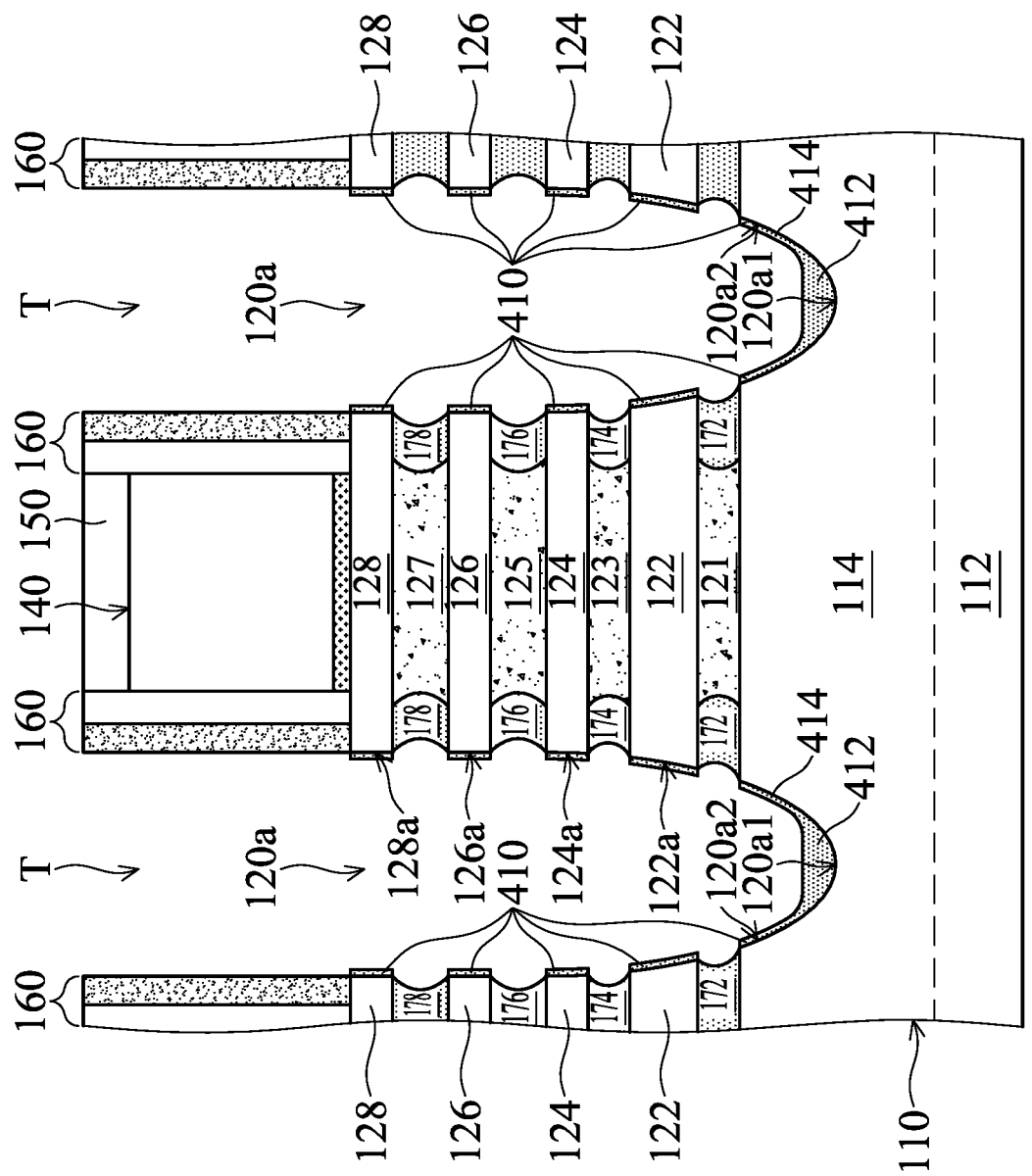

As shown in FIG. 4B, a semiconductor layer 410 is formed over the bottom surface 120*al* and the inner walls 120*a*2 of each trench 120*a*, in accordance with some embodiments. The semiconductor layer 410 is made of a semiconductor material, such as silicon, in accordance with some embodiments. The semiconductor layer 410 is formed using an epitaxial process, in accordance with some embodiments.

Since the epitaxial growth rate of the semiconductor layer 410 over the (100) surface is greater than the epitaxial growth rate of the semiconductor layer 410 over the (110) surface, the semiconductor layer 410 has a thick portion 412 and a thin portion 414, in accordance with some embodiments. The thick portion 412 is over the bottom surface 120*al* of each trench 120*a*, in accordance with some embodiments. The thin portion 414 is over the inner walls 120*a*2 of each trench 120*a*, in accordance with some embodiments.

Figure 4C:
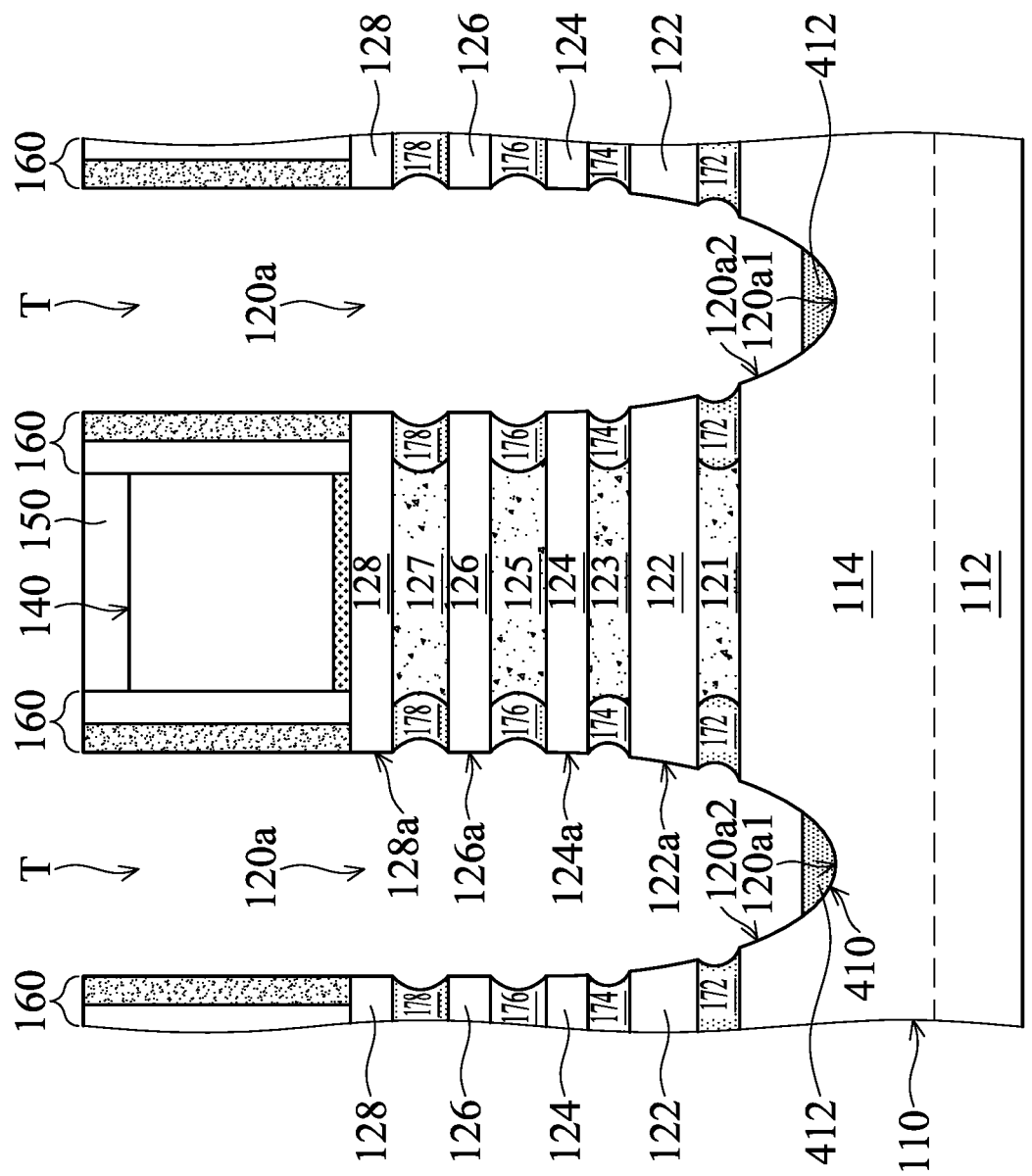

As shown in FIG. 4C, the thin portion 414 of the semiconductor layer 410 is removed, in accordance with some embodiments. The removal process includes an etching process, such as a wet etching process or a dry etching process, in accordance with some embodiments. The dry etching process is performed using an etching gas, such as an HCl-containing gas, in accordance with some embodiments.

Figure 4D:
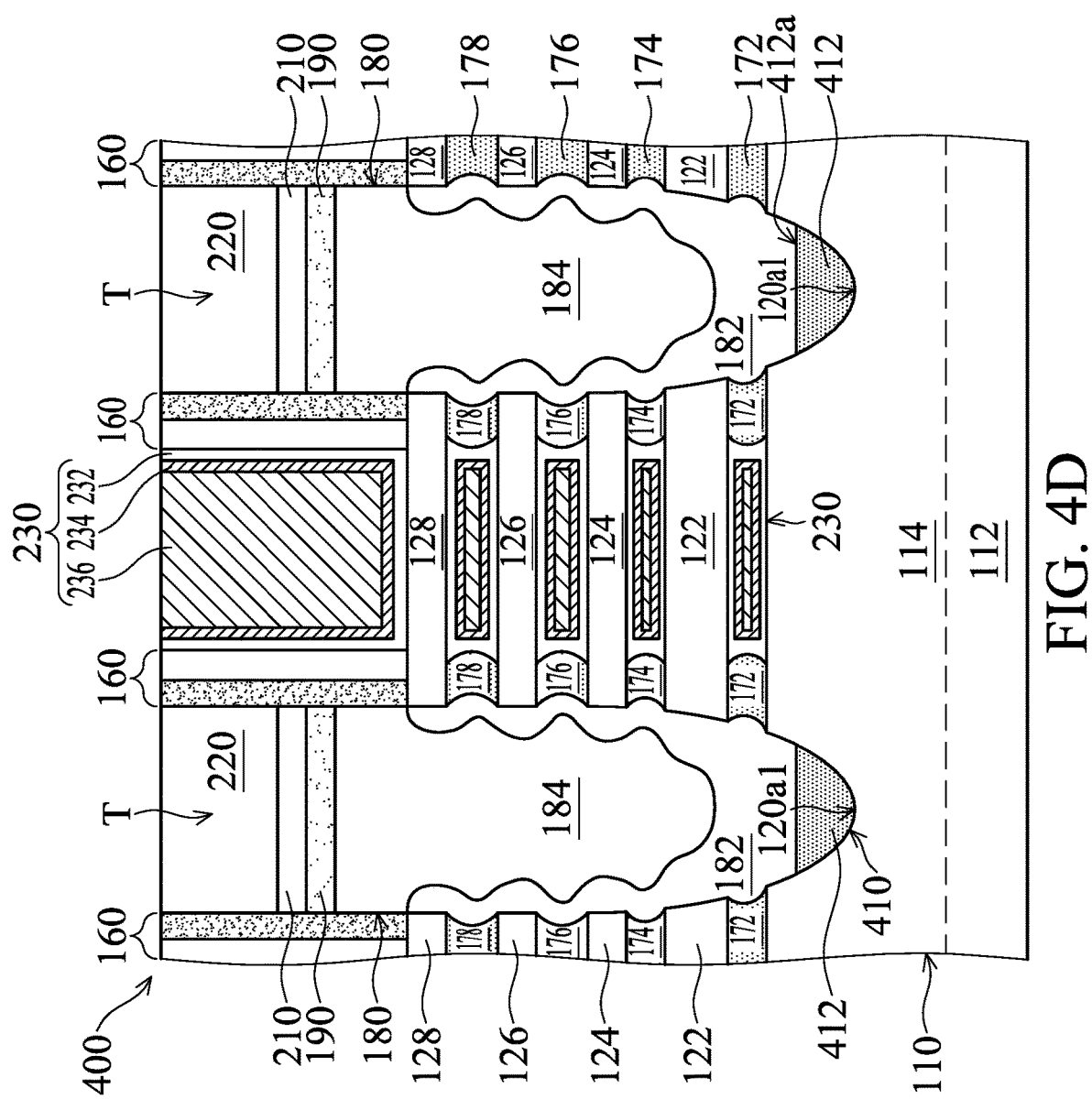

As shown in FIG. 4D, the steps of FIGS. 4B-4C are performed many times to increase the thickness of the thick portion 412, in accordance with some embodiments. The thick portion 412 has a top surface 412a, in accordance with some embodiments. The top surface 412a is a flat top surface, in accordance with some embodiments. The top surface 412a is a (100) surface, in accordance with some embodiments.

As shown in FIG. 4D, the steps of FIGS. 2E-2H are performed to form the stressor structures 180, the cap layer 190, the protection layer 210, and the dielectric layer 220, to remove the mask layer 150, the gate stacks 140, and the nanostructures 121, 123, 125 and 127, and to form the gate stack 230, in accordance with some embodiments. In this step, a semiconductor device structure 400 is substantially formed, in accordance with some embodiments.

Processes and materials for forming the semiconductor device structures 300 and 400 may be similar to, or the same as, those for forming the semiconductor device structure 100 described above. Elements designated by the same reference numbers as those in FIGS. 1A to 4D have the structures and the materials similar thereto or the same thereas. Therefore, the detailed descriptions thereof will not be repeated herein.

In accordance with some embodiments, semiconductor device structures and methods for forming the same are provided. The methods (for forming the semiconductor device structure) form a gate all around structure with a thicker nanostructure and a thinner nanostructure over the thicker nanostructure. The thicker nanostructure laterally overlaps with a larger part of a heavily doped structure of a stressor structure, which increases the stress applied to the thicker nanostructure from the heavily doped structure. Therefore, the channel property of the thicker nanostructure is improved, which improves the performance of the gate all around structure.

In accordance with some embodiments, a semiconductor device structure is provided. The semiconductor device structure includes a substrate having a base and a fin over the base. The semiconductor device structure includes a gate stack over a top portion of the fin. The semiconductor device structure includes a first nanostructure over the fin and passing through the gate stack. The semiconductor device structure includes a second nanostructure over the first nanostructure and passing through the gate stack. The first nanostructure is thicker than the second nanostructure. The semiconductor device structure includes a stressor structure over the fin and connected to the first nanostructure and the second nanostructure.

In accordance with some embodiments, a semiconductor device structure is provided. The semiconductor device structure includes a substrate having a base and a fin over the base. The semiconductor device structure includes a gate stack over a top portion of the fin. The semiconductor device structure includes a first nanostructure over the fin and passing through the gate stack. The semiconductor device structure includes a second nanostructure over the first nanostructure and passing through the gate stack. The semiconductor device structure includes a third nanostructure over the second nanostructure and passing through the gate stack. The gate stack has a first portion, a second portion, and a third portion, the first portion is between and in direct contact with the fin and the first nanostructure, the second portion is between and in direct contact with the first nanostructure and the second nanostructure, the third portion is between and in direct contact with the second nanostructure and the third nanostructure, the third portion is closer to the second portion than the first portion. The semiconductor device structure includes a stressor structure over the fin and connected to the first nanostructure, the second nanostructure, and the third nanostructure.

In accordance with some embodiments, a method for forming a semiconductor device structure is provided. The method includes providing a substrate having a base and a fin over the base. The method includes forming a nanostructure stack over the fin. The nanostructure stack includes a first nanostructure, a second nanostructure, a third nanostructure, and a fourth nanostructure sequentially formed over the fin, and the second nanostructure is thicker than the fourth nanostructure. The method includes forming a gate stack over the nanostructure stack and the fin. The method includes partially removing the nanostructure stack and the fin, which are not covered by the gate stack, to form a trench in the nanostructure stack and the fin. The method includes removing end portions of the first nanostructure and the third nanostructure through the trench to form a first recess and a second recess in the nanostructure stack. The first recess is between the fin and the second nanostructure, and the second recess is between the second nanostructure and the fourth nanostructure. The method includes forming a first inner spacer and a second inner spacer in the first recess and the second recess respectively. The method includes forming a stressor structure in the trench and connected to the second nanostructure and the fourth nanostructure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   providing a substrate having a base and a fin over the base;
   forming a nanostructure stack over the fin, wherein the nanostructure stack comprises a first nanostructure, a second nanostructure, a third nanostructure, and a fourth nanostructure sequentially formed over the fin, and the second nanostructure is thicker than the fourth nanostructure;
   forming a gate stack over the nanostructure stack and the fin;
   partially removing the nanostructure stack and the fin, which are not covered by the gate stack, to form a trench in the nanostructure stack and the fin;
   removing end portions of the first nanostructure and the third nanostructure through the trench to form a first recess and a second recess in the nanostructure stack, wherein the first recess is between the fin and the second nanostructure, and the second recess is between the second nanostructure and the fourth nanostructure;
forming a first inner spacer and a second inner spacer in the first recess and the second recess respectively; and
forming a stressor structure in the trench and connected to the second nanostructure and the fourth nanostructure, wherein the forming of the stressor structure comprises:
forming a lightly doped layer in the trench to cover sidewalls of the first inner spacer, the second nanostructure, the second inner spacer, and the fourth nanostructure; and
forming a heavily doped structure over the lightly doped layer, wherein the lightly doped layer and the heavily doped structure are doped with a dopant, a first concentration of the dopant in the lightly doped layer is less than a second concentration of the dopant in the heavily doped structure, and the heavily doped structure laterally overlaps with the second nanostructure.

2. The method for forming the semiconductor device structure as claimed in claim 1, wherein the second nanostructure is thicker than the first nanostructure.

3. The method for forming the semiconductor device structure as claimed in claim 1, wherein the second nanostructure is thicker than the third nanostructure.

4. The method for forming the semiconductor device structure as claimed in claim 1, further comprising:
before forming the stressor structure in the trench, forming an insulating layer in the trench, and the stressor structure is formed over the insulating layer.

5. The method for forming the semiconductor device structure as claimed in claim 4, wherein the insulating layer and the first inner spacer are made of a same material.

6. The method for forming the semiconductor device structure as claimed in claim 4, wherein the stressor structure partially extends into the insulating layer.

7. The method for forming the semiconductor device structure as claimed in claim 1, wherein the stressor structure partially extends into the first inner spacer and the second inner spacer.

8. The method for forming the semiconductor device structure as claimed in claim 1, wherein a width of the second nanostructure increases toward the fin.

9. The method for forming the semiconductor device structure as claimed in claim 1, wherein a first distance between the second nanostructure and the fin is substantially equal to a second distance between the second nanostructure and the fourth nanostructure.

10. A method for forming a semiconductor device structure, comprising:
providing a substrate having a base and a fin over the base;
forming a nanostructure stack over the fin, wherein the nanostructure stack comprises a first nanostructure, a second nanostructure, a third nanostructure, and a fourth nanostructure sequentially formed over the fin;
forming a gate stack over the nanostructure stack and the fin;
partially removing the nanostructure stack and the fin, which are not covered by the gate stack, to form a trench in the nanostructure stack and the fin;
removing end portions of the first nanostructure and the third nanostructure through the trench to form a first recess and a second recess in the nanostructure stack, wherein the first recess is between the fin and the second nanostructure, and the second recess is between the second nanostructure and the fourth nanostructure;
forming a first inner spacer, a second inner spacer, and an insulating layer in the first recess, the second recess, and a bottom portion of the trench respectively, wherein the second nanostructure is thicker than the first inner spacer, a first top surface of the insulating layer is lower than a second top surface of the fin, the first top surface has a third recess, and the insulating layer is spaced apart from the first inner spacer and the second inner spacer; and
forming a stressor structure in the trench and connected to the second nanostructure and the fourth nanostructure, wherein the stressor structure comprises a lightly doped layer and a heavily doped structure in the lightly doped layer, the lightly doped layer continuously covers sidewalls of the first inner spacer, the second nanostructure, the second inner spacer, and the fourth nanostructure, the lightly doped layer has a first portion and a second portion, the first portion covers the sidewall of the second nanostructure, the second portion covers the sidewall of the fourth nanostructure, the first portion is thicker than the second portion, the lightly doped layer is partially in the third recess of the first top surface of the insulating layer, and the heavily doped structure laterally overlaps with the second nanostructure.

11. The method for forming the semiconductor device structure as claimed in claim 10, wherein the second nanostructure is thicker than the second inner spacer.

12. The method for forming the semiconductor device structure as claimed in claim 10, wherein the fin is wider than the second nanostructure.

13. The method for forming the semiconductor device structure as claimed in claim 12, wherein the second nanostructure is wider than the fourth nanostructure.

14. The method for forming the semiconductor device structure as claimed in claim 10, wherein the first inner spacer is wider than the second inner spacer.

15. The method for forming the semiconductor device structure as claimed in claim 10, wherein the lightly doped layer and the heavily doped structure are doped with a dopant, a first concentration of the dopant in the lightly doped layer is less than a second concentration of the dopant in the heavily doped structure, the lightly doped layer has a first portion and a second portion, the first portion and the second portion have the same first concentration of the dopant, the first portion covers the sidewall of the second nanostructure, the second portion covers the sidewall of the fourth nanostructure, a first thickness of the first portion is greater than a second thickness of the second portion, and the first thickness and the second thickness are measured along a longitudinal axis of the fin.

16. A method for forming a semiconductor device structure, comprising:
providing a substrate;
forming a nanostructure stack over the substrate, wherein the nanostructure stack comprises a first nanostructure, a second nanostructure, a third nanostructure, and a fourth nanostructure sequentially formed over the substrate, the second nanostructure is thicker than the first nanostructure, the second nanostructure is thicker than the third nanostructure, the second nanostructure is thicker than the fourth nanostructure, and a ratio of a first thickness of the second nanostructure to a second thickness of the fourth nanostructure ranges from about 1.5 to about 2;
forming a gate stack over the nanostructure stack and the substrate;

partially removing the nanostructure stack and the substrate, which are not covered by the gate stack, to form a trench in the nanostructure stack and the substrate;

removing end portions of the first nanostructure and the third nanostructure through the trench to form a first recess and a second recess in the nanostructure stack, wherein the first recess is between the substrate and the second nanostructure, and the second recess is between the second nanostructure and the fourth nanostructure;

forming a first inner spacer and a second inner spacer in the first recess and the second recess respectively; and forming a stressor structure in the trench and connected to the second nanostructure and the fourth nanostructure, wherein the stressor structure has a lightly doped portion and a heavily doped portion in the lightly doped portion, the lightly doped portion has a first part and a second part, the first part covers a first sidewall of the second nanostructure, the second part covers a second sidewall of the second inner spacer, the first part has a convex sidewall facing away from the second nanostructure, the second part has a concave sidewall facing away from the second inner spacer, and the heavily doped portion laterally overlaps with the second nanostructure.

17. The method for forming the semiconductor device structure as claimed in claim 16, wherein the second nanostructure has an upper portion and a lower portion, the upper portion is between the lower portion and the third nanostructure, and the upper portion is narrower than the lower portion.

18. The method for forming the semiconductor device structure as claimed in claim 16, wherein the lightly doped portion and the heavily doped portion are doped with a dopant, and a first concentration of the dopant in the lightly doped portion is less than a second concentration of the dopant in the heavily doped portion.

19. The method for forming the semiconductor device structure as claimed in claim 18, wherein the lightly doped portion extends into the first inner spacer.

20. The method for forming the semiconductor device structure as claimed in claim 16, further comprising:

forming an insulating layer in a bottom portion of the trench in the nanostructure stack and the substrate, wherein the insulating layer has a concave curved top surface, the lightly doped portion is over the concave curved top surface of the insulating layer, the lightly doped portion has a first wavy sidewall and a second wavy sidewall opposite to the first wavy sidewall, and the concave curved top surface is connected between the first wavy sidewall and the second wavy sidewall.

* * * * *